(12) United States Patent
Doornbos

(10) Patent No.: US 12,362,015 B2
(45) Date of Patent: Jul. 15, 2025

(54) MEMORY ARRAY STRUCTURE

(71) Applicant: TAIWAN SEMICONDUCTOR MANUFACTURING COMPANY LIMITED, Hsin-Chu (TW)

(72) Inventor: Gerben Doornbos, Kessel-Lo (BE)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 571 days.

(21) Appl. No.: 17/730,350

(22) Filed: Apr. 27, 2022

(65) Prior Publication Data
US 2023/0352089 A1 Nov. 2, 2023

(51) Int. Cl.
| | |
|---|---|
| G11C 16/04 | (2006.01) |
| H01L 23/528 | (2006.01) |
| H10B 41/27 | (2023.01) |
| H10B 41/35 | (2023.01) |
| H10B 43/27 | (2023.01) |
| H10B 43/35 | (2023.01) |

(52) U.S. Cl.
CPC ...... *G11C 16/0483* (2013.01); *H01L 23/5283* (2013.01); *H10B 41/27* (2023.02); *H10B 41/35* (2023.02); *H10B 43/27* (2023.02); *H10B 43/35* (2023.02)

(58) Field of Classification Search
CPC . G11C 16/0483; H01L 23/5283; H10B 41/27; H10B 41/35; H10B 43/27; H10B 43/35; H10B 43/10; H10B 43/30
See application file for complete search history.

(56) References Cited

U.S. PATENT DOCUMENTS

| | | | |
|---|---|---|---|
| 2011/0182098 A1* | 7/2011 | Liaw | H10B 10/00 257/E21.602 |
| 2013/0049095 A1* | 2/2013 | Whang | H10B 41/27 257/E21.09 |
| 2019/0006416 A1* | 1/2019 | Lee | H01L 22/22 |
| 2019/0326296 A1* | 10/2019 | Wang | H01L 27/124 |
| 2020/0411486 A1* | 12/2020 | Or-Bach | H01L 27/0688 |

OTHER PUBLICATIONS

"A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. (Year: 2010).*

* cited by examiner

*Primary Examiner* — Kyoung Lee
*Assistant Examiner* — Christina A Sylvia
(74) *Attorney, Agent, or Firm* — Cooper Legal Group, LLC

(57) ABSTRACT

A semiconductor device is provided. The semiconductor device includes a logic structure overlying a semiconductor substrate of the semiconductor device. The logic structure includes a plurality of logic cells. The semiconductor device includes one or more interconnection layers, overlying the logic structure, in a Back End of Line (BEOL) structure of the semiconductor device. The semiconductor device includes a non-volatile memory array, including a plurality of memory cells, overlying the logic structure and the one or more interconnection layers, wherein the non-volatile memory array at least one of overlies or is within the BEOL structure.

20 Claims, 17 Drawing Sheets

100 ⟶

100 ⟶

100

100

MEMORY ARRAY STRUCTURE

BACKGROUND

Semiconductor devices are used in a multitude of electronic devices, such as mobile phones, laptops, desktops, tablets, watches, gaming systems, and various other industrial, commercial, and consumer electronics. Semiconductor devices generally comprise semiconductor portions and wiring portions formed inside the semiconductor portions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
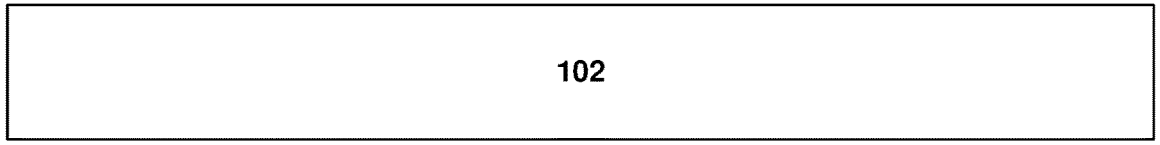
FIG. 1 illustrates a memory array structure at a stage of fabrication, in accordance with some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

The term "overlying" and/or the like may be used to describe one element or feature being vertically coincident with and at a higher elevation than another element or feature. For example, a first element overlies a second element if the first element is at a higher elevation than the second element and at least a portion of the first element is vertically coincident with at least a portion of the second element.

The term "underlying" and/or the like may be used to describe one element or feature being vertically coincident with and at a lower elevation than another element or feature. For example, a first element underlies a second element if the first element is at a lower elevation than the second element and at least a portion of the first element is vertically coincident with at least a portion of the second element.

The term "over" may be used to describe one element or feature being at a higher elevation than another element or feature. For example, a first element is over a second element if the first element is at a higher elevation than the second element.

The term "under" may be used to describe one element or feature being at a lower elevation than another element or feature. For example, a first element is under a second element if the first element is at a lower elevation than the second element.

Some embodiments relate to a semiconductor device. In accordance with some embodiments, the semiconductor device comprises a memory array, such as a non-volatile memory array, and a logic structure. In some embodiments, the memory array 2920 is a flash memory array, such as a memory array that can be operated as at least one of NAND flash or NOR flash. The memory array comprises a plurality of memory cells. The logic structure comprises a plurality of logic cells. The memory array overlies the logic structure. The logic structure is in a Front End of Line (FEOL) structure of the semiconductor device. In some embodiments, the semiconductor device comprises one or more interconnection layers in a Back End of Line (BEOL) structure, of the semiconductor device, overlying the FEOL structure. In some embodiments, the memory array overlies at least one of the FEOL structure or the one or more interconnection layers. In some embodiments, the memory array at least one of overlies or is within the BEOL structure. Other structures and/or configurations of the semiconductor device are within the scope of the present disclosure. Implementing the memory array to overlie at least one of the logic structure or the one or more interconnection layers provides for in-memory computing and/or near-memory computing of the semiconductor device, thereby providing for increased processing and/or computing speed as compared to semiconductor devices, such as logic chips, that are connected to memory circuitry on separate devices, such as standalone flash memory. Implementing the memory array to overlie at least one of the logic structure or the one or more interconnection layers provides for at least one of reduced manufacturing costs, reduced complexity, reduced footprint, increased memory cell density, etc. as compared to at least one of semiconductor devices with memory arrays that are laterally coincident with logic structures or semiconductor devices with memory arrays formed within FEOL structures comprising logic structures.

FIGS. 1-10 illustrate a memory array structure 100 at various stages of fabrication, in accordance with some embodiments. A semiconductor device, such as at least one of a logic chip, a memory chip, etc., comprises the memory array structure 100. The semiconductor device is configured for at least one of processing data or memory storage. Other structures and/or configurations of the memory array structure 100 and/or the semiconductor device are within the scope of the present disclosure.

FIG. 1 illustrates the memory array structure 100 according to some embodiments. In some embodiments, the memory array structure 100 comprises a first dielectric layer 102. In some embodiments, the first dielectric layer 102 is formed over at least one of a logic structure, an FEOL structure comprising the logic structure, or one or more interconnection layers in a BEOL structure. In some embodiments, the first dielectric layer 102 is formed at least one of over or within the BEOL structure. The first dielectric layer 102 is an interlayer dielectric layer. The first dielectric layer 102 comprises at least one of silicon, nitride, oxide, such as silicon dioxide ($SiO_2$), or other suitable material. Other structures and/or configurations of the first dielectric layer 102 are within the scope of the present disclosure. The first dielectric layer 102 is formed by at least one of physical vapor deposition (PVD), sputtering, chemical vapor deposition (CVD), low pressure CVD (LPCVD), atomic layer chemical vapor deposition (ALCVD), ultrahigh vacuum CVD (UHVCVD), reduced pressure CVD (RPCVD), atomic layer deposition (ALD), molecular beam epitaxy (MBE), liquid phase epitaxy (LPE), spin on, growth, or other suitable techniques.

Figure 2:
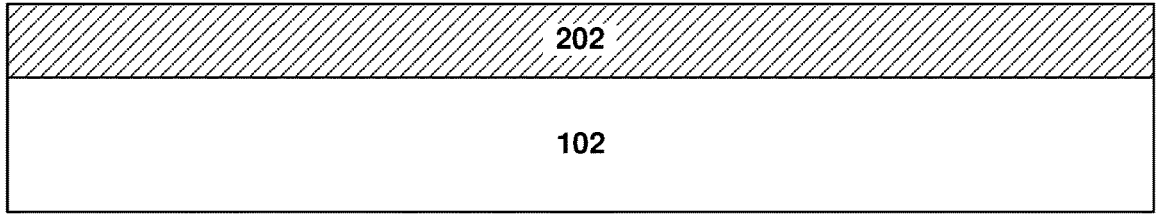
FIG. 2 illustrates a memory array structure at a stage of fabrication, in accordance with some embodiments.

FIG. 2 illustrates a gate layer 202 formed over the first dielectric layer 102, according to some embodiments. The gate layer 202 at least one of overlies the first dielectric layer 102, is in direct contact with a top surface of the first dielectric layer 102, or is in indirect contact with the top surface of the first dielectric layer 102. In some embodiments, one or more layers, such as a buffer layer, are between the gate layer 202 and the first dielectric layer 102. The gate layer 202 comprises a conductor, such as a metal, or a doped semiconductor. The gate layer 202 comprises at least one of titanium, tungsten, nitride, such as titanium nitride (TiN), or other suitable material. The gate layer 202 is formed by at least one of PVD, sputtering, CVD, LPCVD, ALCVD, UHVCVD, RPCVD, ALD, MBE, LPE, spin on, growth, or other suitable techniques. Other structures and/or configurations of the gate layer 202 are within the scope of the present disclosure.

Figure 3A:
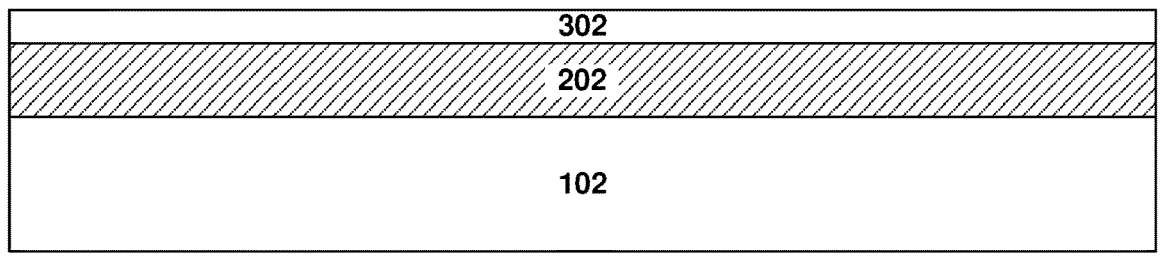
FIGS. 3A-3B illustrate a memory array structure at a stage of fabrication, in accordance with some embodiments.

FIG. 3A illustrates one or more second dielectric layers 302 formed over the gate layer 202, according to some embodiments. The one or more second dielectric layers 302 at least one of overlie the gate layer 202, are in direct contact with a top surface of the gate layer 202, or are in indirect contact with the top surface of the gate layer 202. In some embodiments, one or more layers, such as a buffer layer, are between the one or more second dielectric layers 302 and the gate layer 202. A dielectric layer of the one or more second dielectric layers 302 comprises at least one of at least one of silicon, nitride, such as silicon nitride ($Si_3N_4$), oxide, such as silicon dioxide ($SiO_2$), or other suitable material. In some embodiments, a dielectric layer of the one or more second dielectric layers 302 comprises a high-k dielectric, such as at least one of aluminum oxide ($Al_2O_3$), hafnium dioxide ($HfO_2$), hafnium zirconium oxide (HfZrO), zirconium dioxide ($ZrO_2$), or other suitable material. As used herein, the term "high-k dielectric material" refers to a material having a dielectric constant, k, greater than or equal to about 3.9. A dielectric layer of the one or more second dielectric layers 302 is formed by at least one of PVD, sputtering, CVD, LPCVD, ALCVD, UHVCVD, RPCVD, ALD, MBE, LPE, spin on, growth, or other suitable techniques. Other structures and/or configurations of the one or more second dielectric layers 302 are within the scope of the present disclosure.

Figure 3B:
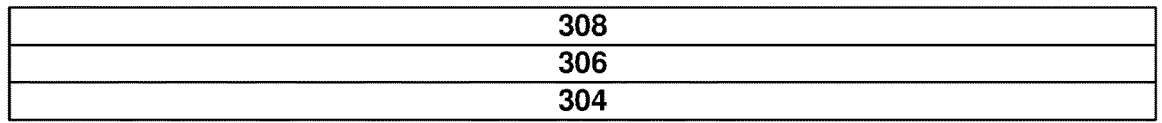

In some embodiments, the one or more second dielectric layers 302 comprise an oxide-nitride-oxide (ONO) tri-layer. FIG. 3B illustrates the one or more second dielectric layers 302 according to embodiments in which the one or more second dielectric layers 302 comprise the ONO tri-layer. The ONO tri-layer of the one or more second dielectric layers 302 comprises a first oxide layer 308, a nitride layer 306, and a second oxide layer 304. The first oxide layer 308 at least one of overlies the nitride layer 306, is in direct contact with a top surface of the nitride layer 306, or is in indirect contact with the top surface of the nitride layer 306. The nitride layer 306 at least one of overlies the second oxide layer 304, is in direct contact with a top surface of the second oxide layer 304, or is in indirect contact with the top surface of the second oxide layer 304. The first oxide layer 308 comprises an oxide, such as silicon dioxide ($SiO_2$). The nitride layer 306 comprises a nitride, such as silicon nitride ($Si_3N_4$). The second oxide layer 304 comprises an oxide, such as silicon dioxide ($SiO_2$). Other structures and/or configurations of the ONO tri-layer are within the scope of the present disclosure.

Figure 4:
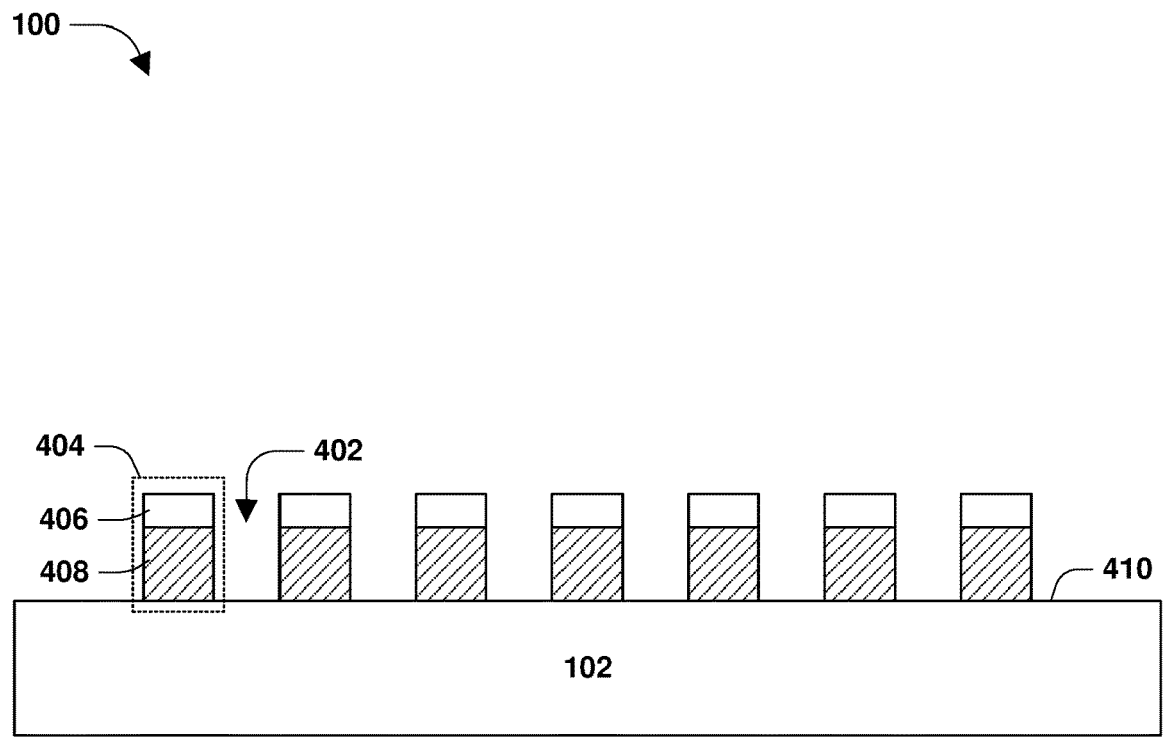
FIG. 4 illustrates a memory array structure at a stage of fabrication, in accordance with some embodiments.

FIG. 4 illustrates gate-and-charge storing components 404 formed from the gate layer 202 and the one or more second dielectric layers 302, according to some embodiments. In some embodiments, the gate layer 202 and the one or more second dielectric layers 302 are patterned to form the gate-and-charge storing components 404, such as by removing portions of the gate layer 202 and the one or more second dielectric layers 302 to form openings 402 through the one or more second dielectric layers 302 and the gate layer 202. In some embodiments, the openings 402 expose portions of a top surface 410 of the first dielectric layer 102. A gate-and-charge storing component 404 comprises a gate 408 formed from the gate layer 202 and a charge storing component 406 formed from the one or more second dielectric layers 302. Other structures and/or configurations of the gate-and-charge storing components 404 are within the scope of the present disclosure.

According to some embodiments, the gate-and-charge storing components 404 are formed using a photoresist (not shown). The photoresist is formed over the one or more second dielectric layers 302 by at least one of PVD, sputtering, CVD, LPCVD, ALCVD, UHVCVD, RPCVD, ALD, MBE, LPE, spin on, growth, or other suitable techniques. The photoresist comprises a light-sensitive material, where properties, such as solubility, of the photoresist are affected by light. The photoresist is a negative photoresist or a positive photoresist. With respect to a negative photoresist, regions of the negative photoresist become insoluble when illuminated by a light source, such that application of a solvent to the negative photoresist during a subsequent development stage removes non-illuminated regions of the negative photoresist. A pattern formed in the negative photoresist is thus a negative image of a pattern defined by opaque regions of a template, such as a mask, between the light source and the negative photoresist. In a positive photoresist, illuminated regions of the positive photoresist become soluble and are removed via application of a solvent during development. Thus, a pattern formed in the positive photoresist is a positive image of opaque regions of the template, such as a mask, between the light source and the positive photoresist.

In some embodiments, an etching process is performed to remove portions of the one or more second dielectric layers 302 and the gate layer 202 to form the openings 402, where an opening in the photoresist allows one or more etchants applied during the etching process to remove the portions of the one or more second dielectric layers 302 and the gate layer 202 to form the openings 402 while the photoresist protects or shields portions of the one or more second dielectric layers 302 that are covered by the photoresist. The etching process is at least one of a dry etching process, a wet etching process, an anisotropic etching process, an isotropic etching process, or other suitable etching process. The etching process uses at least one of fluorine, hydrogen fluoride (HF), diluted HF, sulfur hexafluoride ($SF_6$), a chlorine compound such as hydrogen chloride ($HCl_2$), hydrogen sulfide ($H_2S$), tetrafluoromethane ($CF_4$), or other suitable material. The photoresist is stripped or washed away after the gate-and-charge storing components 404 are formed. Other processes and/or techniques for forming the gate-and-charge storing components 404 are within the scope of the present disclosure.

In some embodiments, one, some and/or all gates 408 of the memory array structure 100 are spaced apart in a regular manner, such as where one, some and/or all gates 408 of the memory array structure 100 have about the same pitch.

In some embodiments, one, some and/or all gates 408 of the memory array structure 100 are control gates of transistors of the memory array structure 100.

In some embodiments, at least one of one or more gates 408 or one or more charge storing components 406 may be formed using a damascene process (not shown) in which one or more trenches are formed in the first dielectric layer 102 and at least one of the one or more gates 408 or the one or more charge storing components 406 are formed in the one or more trenches.

Figure 5:
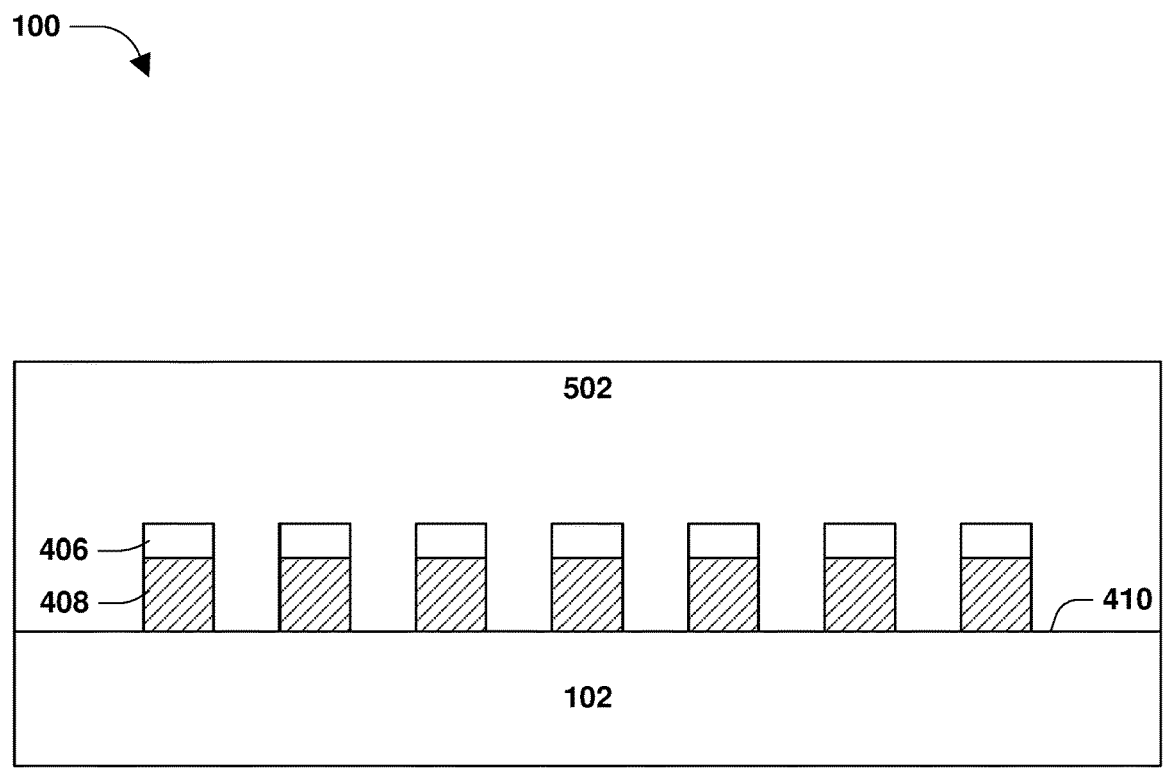
FIG. 5 illustrates a memory array structure at a stage of fabrication, in accordance with some embodiments.

FIG. 5 illustrates a third dielectric layer 502 formed over at least one of the first dielectric layer 102 or the gate-and-charge storing components 404, according to some embodiments. The third dielectric layer 502 comprises at least one of silicon, nitride, oxide, such as $SiO_2$, or other suitable material. The third dielectric layer 502 is formed by at least one of PVD, sputtering, CVD, LPCVD, ALCVD, UHVCVD, RPCVD, ALD, MBE, LPE, spin on, growth, or other suitable techniques. The third dielectric layer 502 is an interlayer dielectric layer. Other structures and/or configurations of the third dielectric layer 502 are within the scope of the present disclosure.

In some embodiments, the third dielectric layer 502 is in direct contact with the top surface 410 of the first dielectric layer 102. In some embodiments, the third dielectric layer 502 is different than the first dielectric layer 102, such as having a different material composition, such that an interface is defined between the third dielectric layer 502 and the first dielectric layer 102. In some embodiments, the third dielectric layer 502 does not have a material composition different than the first dielectric layer 102, and an interface between the third dielectric layer 502 and the first dielectric layer 102 may be defined due to the third dielectric layer 502 and the first dielectric layer 102 being separate, different, etc. layers. Embodiments are contemplated in which an interface between the third dielectric layer 502 and the first dielectric layer 102 is not defined. In some embodiments, the third dielectric layer 502 is in indirect contact with the top surface 410 of the first dielectric layer 102, where one or more layers, such as a buffer layer, are between the third dielectric layer 502 and the first dielectric layer 102. The third dielectric layer 502 at least one of overlies the gate-and-charge storing components 404, is in direct contact with top surfaces and/or sidewalls of the gate-and-charge storing components 404, or is in indirect contact with top surfaces and/or sidewalls of the gate-and-charge storing components 404. Other structures and/or configurations of the third dielectric layer 502 relative to other elements, features, etc. are within the scope of the present disclosure.

Figure 6:
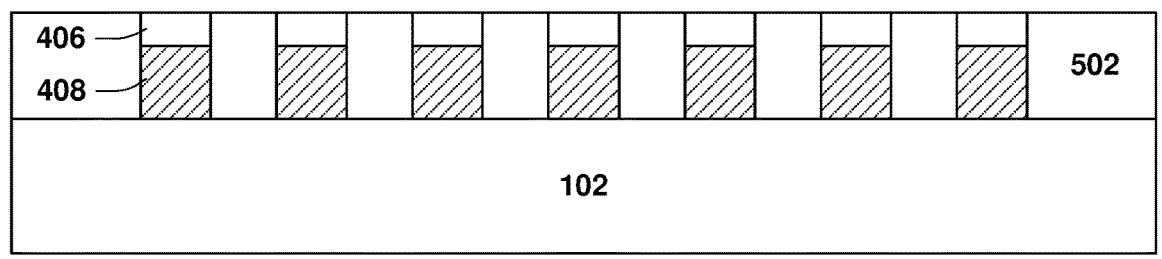
FIG. 6 illustrates a memory array structure at a stage of fabrication, in accordance with some embodiments.

FIG. 6 illustrates removal of a portion of the third dielectric layer 502, according to some embodiments. The portion of the third dielectric layer 502 is removed by at least one of chemical mechanical planarization (CMP), etching, or other suitable techniques. In some embodiments, removal of the portion of the third dielectric layer 502 exposes top surfaces of one, some and/or all gate-and-charge storing components of the gate-and-charge storing components 404. In some embodiments, a top surface of a gate-and-charge storing component 404 is level or coplanar with a top surface of the third dielectric layer 502. Other structures and/or configuration of the third dielectric layer 502 and/or the gate-and-charge storing components 404 are within the scope of the present disclosure.

Figure 7:
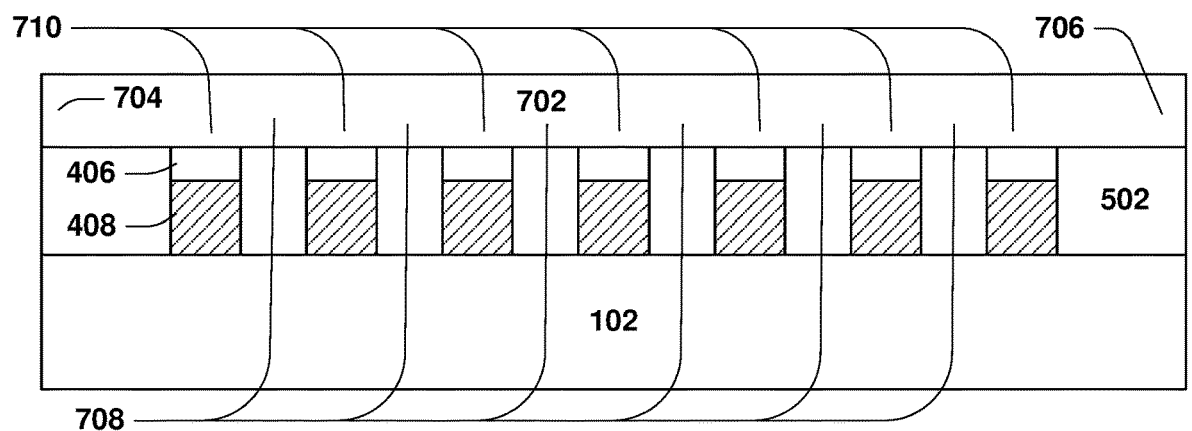
FIG. 7 illustrates a memory array structure at a stage of fabrication, in accordance with some embodiments.

FIG. 7 illustrates a channel layer 702 formed over the third dielectric layer 502 and the gate-and-charge storing components 404, according to some embodiments. The channel layer 702 at least one of overlies the third dielectric layer 502, is in direct contact with a top surface of the third dielectric layer 502, or is in indirect contact with the top surface of the third dielectric layer 502. The channel layer 702 at least one of overlies one, some and/or all gate-and-charge storing components of the gate-and-charge storing components 404, is in direct contact with top surfaces of one, some and/or all gate-and-charge storing components of the gate-and-charge storing components 404, or is in indirect contact with the top surfaces of one, some and/or all gate-and-charge storing components of the gate-and-charge storing components 404. In some embodiments, one or more layers, such as a buffer layer, are between the channel layer 702 and at least one of the third dielectric layer 502 or one, some and/or all gate-and-charge storing components of the gate-and-charge storing components 404. The channel layer 702 comprises at least one of an oxide semiconductor material or other suitable material. The channel layer 702 comprises at least one of InGaZnO, InSnO, InWO, $In_2O_3$, $Ga_2O_3$, InGaZnO:Si, or other suitable material. The channel layer 702 is formed by at least one of PVD, sputtering, CVD, LPCVD, ALCVD, UHVCVD, RPCVD, ALD, MBE, LPE, spin on, growth, or other suitable techniques. Other structures and/or configurations of the channel layer 702 are within the scope of the present disclosure.

In some embodiments, at least one of dopant concentration or resistivity across at least some of the channel layer 702 is irregular. In some embodiments, a first dopant concentration of first portions 708, of the channel layer 702, that are laterally offset from the gates 408 is different than a second dopant concentration of second portions 710, of the channel layer 702, that are vertically coincident with the gates 408. In some embodiments, a first resistivity of the first portions 708 of the channel layer 702 is different than a second resistivity of the second portions 710 of the channel layer 702. In some embodiments, the first dopant concentration is higher than the second dopant concentration. In some embodiment, the first resistivity is lower than the second resistivity. In some embodiments, at least one of the first dopant concentration or the first resistivity of the first portions 708 provide for a sufficient level of conductivity between transistors comprising the gates 408. In some embodiments, at least one of the second dopant concentration or the second resistivity of the second portions 710 enable gate modulation of at least one of the electron concentration, hole concentration, or resistivity of second portions 710 by the gates 408 using a gate potential. In some embodiments, at least some of the channel layer 702 is doped by at least one of ion implantation, molecular diffusion, or other suitable techniques. Other processes and/or techniques for at least one of doping at least some of the channel layer 702 are within the scope of the present disclosure.

Figure 8:
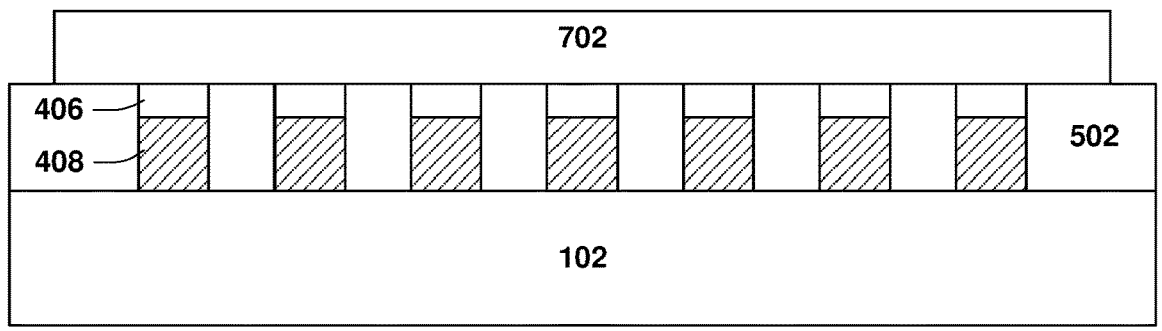
FIG. 8 illustrates a memory array structure at a stage of fabrication, in accordance with some embodiments.

FIG. 8 illustrates removal of one or more portions of the channel layer 702, according to some embodiments. In some embodiments, the one or more portions of the channel layer 702 comprise a portion 704 and a portion 706 of the channel layer 702 (shown in FIG. 7). In some embodiments, removal of the one or more portions of the channel layer 702 exposes one or more portions of the top surface of the third dielectric layer 502. In some embodiments, the one or more portions of the channel layer 702 that are removed overlie an inactive region of the memory array structure 100, such as a region that does not comprise one, some and/or all gates 408 of the memory array structure 100. In some embodiments, the one or more portions of the channel layer 702 are laterally offset from one, some and/or all gates 408 of the memory array structure 100.

According to some embodiments, the one or more portions of the channel layer 702 are removed using a photoresist (not shown). The photoresist is formed over the channel layer 702 by at least one of PVD, sputtering, CVD, PECVD, LPCVD, ALCVD, UHVCVD, RPCVD, ALD, MBE, LPE, spin on, growth, or other suitable techniques. The photoresist comprises a light-sensitive material, where properties, such as solubility, of the photoresist are affected by light. The photoresist is a negative photoresist or a positive photoresist.

In some embodiments, an etching process is performed to remove the one or more portions of the channel layer 702, where openings in the photoresist allow one or more etchants applied during the etching process to remove the one or more portions of the channel layer 702 while the photoresist protects or shields portions of the channel layer 702 that are covered by the photoresist. The etching process is at least one of a dry etching process, a wet etching process, an anisotropic etching process, an isotropic etching process, or other suitable etching process. The etching process uses at least one of fluorine, HF, diluted HF, $SF_6$, a chlorine compound such as $HCl_2$, $H_2S$, $CF_4$, or other suitable material. The photoresist is stripped or washed away after the one or more portions of the channel layer 702 are removed. Other processes and/or techniques for removing the one or more portions of the channel layer 702 are within the scope of the present disclosure.

Figure 9:
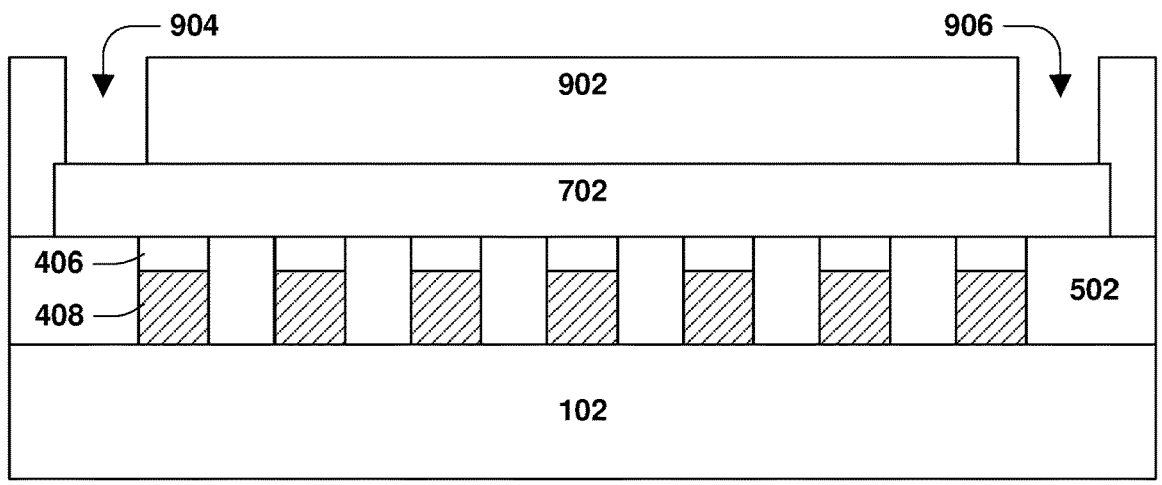
FIG. 9 illustrates a memory array structure at a stage of fabrication, in accordance with some embodiments.

FIG. 9 illustrates a fourth dielectric layer 902 formed over at least one of the channel layer 702, the third dielectric layer 502, the first dielectric layer 102, or the gate-and-charge storing components 404, according to some embodiments. The fourth dielectric layer 902 comprises at least one of silicon, nitride, oxide, such as $SiO_2$, or other suitable material. The fourth dielectric layer 902 is formed by at least one of PVD, sputtering, CVD, LPCVD, ALCVD, UHVCVD, RPCVD, ALD, MBE, LPE, spin on, growth, or other suitable techniques. The fourth dielectric layer 902 at least one of overlies the channel layer 702, is in direct contact with sidewalls and/or a top surface of the channel layer 702, or is in indirect contact with sidewalls and/or the top surface of the channel layer 702.

In some embodiments, the fourth dielectric layer 902 is in direct contact with the top surface of the third dielectric layer 502. In some embodiments, the fourth dielectric layer 902 is different than the third dielectric layer 502, such as having a different material composition, such that an interface is defined between the fourth dielectric layer 902 and the third dielectric layer 502. In some embodiments, the fourth dielectric layer 902 does not have a material composition different than the third dielectric layer 502, and an interface between the fourth dielectric layer 902 and the third dielectric layer 502 may be defined due to the fourth dielectric layer 902 and the third dielectric layer 502 being separate, different, etc. layers. Embodiments are contemplated in which an interface between the fourth dielectric layer 902 and the third dielectric layer 502 is not defined. In some embodiments, the fourth dielectric layer 902 is in indirect contact with the top surface of the third dielectric layer 502, where one or more layers, such as a buffer layer, are between the fourth dielectric layer 902 and the third dielectric layer 502. The fourth dielectric layer 902 at least one of overlies the third dielectric layer 502, is in direct contact with a top surface of the third dielectric layer 502, or is in indirect contact with the top surface of the third dielectric layer 502. Other structures and/or configurations of the fourth dielectric layer 902 are within the scope of the present disclosure.

In some embodiments, portions of the fourth dielectric layer 902 are removed to form a first trench 904 and a second trench 906 through the fourth dielectric layer 902. In some embodiments, the first trench 904 and the second trench 906 expose portions of the top surface of the channel layer 702. According to some embodiments, the first trench 904 and the second trench 906 are formed using a photoresist (not shown). The photoresist is formed over the fourth dielectric layer 902 by at least one of PVD, sputtering, CVD, PECVD, LPCVD, ALCVD, UHVCVD, RPCVD, ALD, MBE, LPE, spin on, growth, or other suitable techniques. The photoresist comprises a light-sensitive material, where properties, such as solubility, of the photoresist are affected by light. The photoresist is a negative photoresist or a positive photoresist.

In some embodiments, an etching process is performed to remove the one or more portions of the fourth dielectric layer 902, where openings in the photoresist allow one or more etchants applied during the etching process to remove the one or more portions of the fourth dielectric layer 902 while the photoresist protects or shields portions of the fourth dielectric layer 902 that are covered by the photoresist. The etching process is at least one of a dry etching process, a wet etching process, an anisotropic etching process, an isotropic etching process, or other suitable etching process. The etching process uses at least one of fluorine, HF, diluted HF, $SF_6$, a chlorine compound such as $HCl_2$, $H_2S$, $CF_4$, or other suitable material. The photoresist is stripped or washed away after the one or more portions of the fourth dielectric layer 902 are removed to form the first trench 904 and the second trench 906. Other processes and/or techniques for removing the one or more portions of the fourth dielectric layer 902 and/or for forming the first trench 904 and the second trench 906 are within the scope of the present disclosure.

Figure 10:
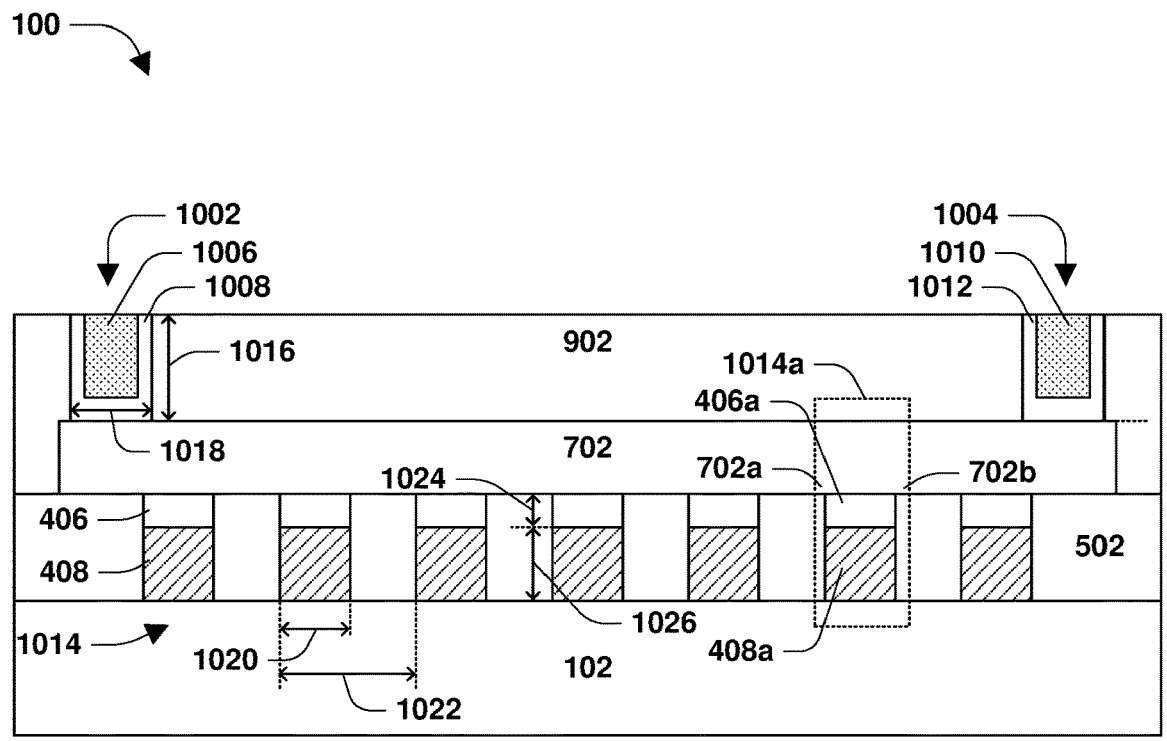
FIG. 10 illustrates a memory array structure at a stage of fabrication, in accordance with some embodiments.

FIG. 10 illustrates a first contact 1002 and a second contact 1004 formed in the fourth dielectric layer 902, according to some embodiments. The first contact 1002 at least one of overlies the channel layer 702, is in direct contact with the top surface of the channel layer 702, or is in indirect contact with the top surface of the channel layer 702. The second contact 1004 at least one of overlies the channel layer 702, is in direct contact with the top surface of the channel layer 702, or is in indirect contact with the top surface of the channel layer 702.

At least one of the first contact 1002 is a first metal contact or the second contact 1004 is a second metal contact. The first contact 1002 comprises at least one of titanium, tungsten, nitride, or other suitable material. In some embodiments, a material of a first portion 1006 of the first contact 1002 is different than a material of a second portion 1008 of the first contact 1002. The second contact 1004 comprises at least one of titanium, tungsten, nitride, or other suitable material. In some embodiments, a material of a first portion 1010 of the second contact 1004 is different than a material of a second portion 1012 of the second contact 1004. At least one of the first portion 1006 of the first contact 1002 or the first portion 1010 of the second contact 1004 comprise a first material, such as tungsten or other suitable material. At least one of the second portion 1008 of the first contact 1002 or the second portion 1012 of the second contact 1004 comprise a second material, such as titanium nitride (TiN) or other suitable material. Other structures and/or configurations of the first contact 1002 and/or the second contact 1004 are within the scope of the present disclosure.

In some embodiments, the first contact 1002 and the second contact 1004 are formed by a damascene process. In some embodiments, the first contact 1002 and the second contact 1004 are formed by depositing one or more layers at least one of over the fourth dielectric layer 902 or within the first trench 904 and the second trench 906. The one or more layers are deposited by at least one of PVD, sputtering, CVD, PECVD, LPCVD, ALCVD, UHVCVD, RPCVD, ALD, MBE, LPE, spin on, growth, or other suitable techniques. In some embodiments, a top portion of the one or more layers, such as a portion of the one or more layers over a top surface of the fourth dielectric layer 902, is removed to form the first contact 1002 and the second contact 1004. In some embodiments, the one or more layers comprise a first layer comprising the first material and a second layer comprising the second material. Other processes and/or techniques for forming the first contact 1002 and the second contact 1004 are within the scope of the present disclosure.

In some embodiments, the memory array structure 100 comprises a memory array, such as a non-volatile memory array. In some embodiments, the memory array is a flash memory array, such as a memory array that can be operated as at least one of NAND flash or NOR flash. The memory array comprises a plurality of memory cells 1014 comprising a memory cell 1014a. The memory cell 1014a comprises a gate 408a, such as a control gate of the memory cell 1014a, a charge storing component 406a, and a portion of the channel layer 702. In some embodiments, the memory cell 1014a comprises a transistor, such as a thin film transistor or other suitable transistor, wherein the transistor comprises at least one of the gate 408a, a first portion 702a of the channel layer 702 corresponding to a source of the transistor, a second portion 702b of the channel layer 702 corresponding to a drain of the transistor, or the charge storing component 406a, wherein a threshold voltage of the transistor is based upon a charge stored in the charge storing component 406a. In some embodiments, the first portion 702a is a first doped portion of the channel layer 702. In some embodiments, the second portion 702b is a second doped portion of the channel layer 702. In some embodiments, the charge is trapped in a dielectric charge trapping element of the charge storing component 406a, such as a nitride layer of an ONO tri-layer of the charge storing component 406a. In some embodiments, electrons are attracted to the charge storing component 406a when a positive voltage is applied to the gate 408a. In some embodiments, electrons are repelled by the charge storing component 406a when a negative voltage is applied to the gate 408a. In some embodiments, the transistor switches between a plurality of transistor states, such as two transistor states, associated with a plurality of threshold voltage levels of the transistor. In some embodiments, the transistor is in a first transistor state when a first amount of charge is stored in the charge storing component 406a, wherein the first transistor state is associated with the threshold voltage of the transistor being equal to about a first threshold level of the plurality of threshold voltage levels. The first amount of charge can be positive, negative, or zero. In some embodiments, the transistor is in a second transistor state when a second amount of charge is stored in the charge storing component 406a, the second amount of charge being different than the first amount of charge, wherein the second transistor state is associated with the threshold voltage of the transistor being equal to about a second threshold level of the plurality of threshold voltage levels. Other structures and/or configurations of the memory cell 1014a are within the scope of the present disclosure.

A length 1020 of a gate of a memory cell of the plurality of memory cells 1014 is between about 20 nanometers to about 50 nanometers. A thickness 1026 of a gate 408 of a memory cell of the plurality of memory cells 1014 is between about 20 nanometers to about 50 nanometers. A thickness 1024 of a charge storing component 406 of a memory cell of the plurality of memory cells 1014 is between about 4 nanometers to about 16 nanometers. A pitch 1022 of gates 408 of memory cells of the plurality of memory cells 1014 is between about 30 nanometers and about 80 nanometers. A thickness 1016 of at least one of the first contact 1002 or the second contact 1004 is between about 20 nanometers to about 50 nanometers. A length 1018 of at least one of the first contact 1002 or the second contact 1004 is between about 15 nanometers to about 30 nanometers. Other values of the length 1020, the thickness 1026, the thickness 1024, the pitch 1022, the thickness 1016 and/or the length 1018 are within the scope of the present disclosure.

FIGS. 11-14 illustrate a memory array structure 1100 at various stages of fabrication, in accordance with some embodiments. A semiconductor device, such as at least one of a logic chip, a memory chip, etc., comprises the memory array structure 1100. The semiconductor device is configured for at least one of processing data or memory storage. Other structures and/or configurations of the memory array structure 1100 and/or the semiconductor device are within the scope of the present disclosure.

Figure 11:
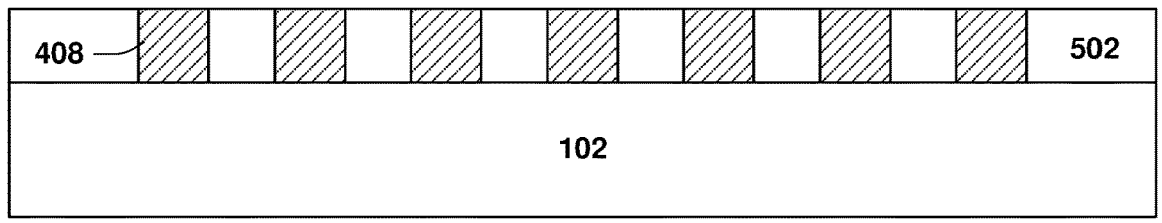
FIG. 11 illustrates a memory array structure at a stage of fabrication, in accordance with some embodiments.

FIG. 11 illustrates the memory array structure 1100 according to some embodiments. In some embodiments, the memory array structure 1100 comprises the first dielectric layer 102, the third dielectric layer 502 and gates 408. In some embodiments, the gates 408 are embedded in the third dielectric layer 502. In some embodiments, the arrangement of the memory array structure 1100 shown in FIG. 11 is formed, using one or more of the techniques shown in and/or described with respect to FIGS. 1-6, without forming the one or more second dielectric layers 302 over the gate layer 202. Other processes and/or techniques for forming the arrangement of the memory array structure 1100 shown in FIG. 11 are within the scope of the present disclosure.

Figure 12:
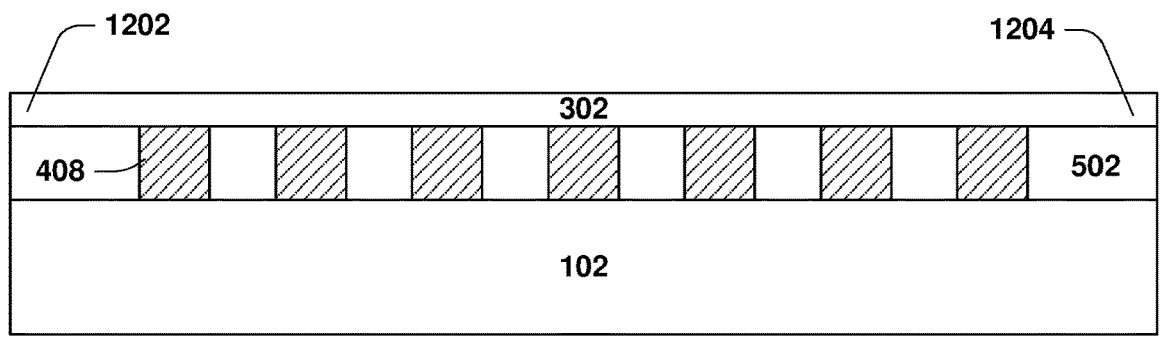
FIG. 12 illustrates a memory array structure at a stage of fabrication, in accordance with some embodiments.

FIG. 12 illustrates the one or more second dielectric layers 302 formed over at least one of the first dielectric layer 102, the third dielectric layer 502, or the gates 408. The one or more second dielectric layers 302 at least one of overlie the gates 408, are in direct contact with top surfaces of the gates 408, or are in indirect contact with the top surfaces of the gates 408. The one or more second dielectric layers 302 at least one of overlie the third dielectric layer 502, are in direct contact with a top surface of the third dielectric layer 502, or are in indirect contact with the top surface of the third dielectric layer 502. In some embodiments, one or more layers, such as a buffer layer, are between the one or more second dielectric layers 302 and at least one of the gate layer 202 or the third dielectric layer 502. Other structures and/or configurations of the one or more second dielectric layers 302 are within the scope of the present disclosure.

Figure 13:
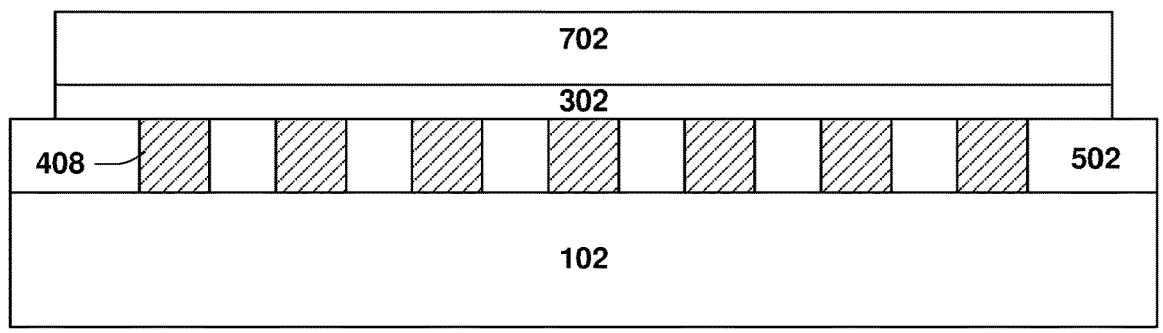
FIG. 13 illustrates a memory array structure at a stage of fabrication, in accordance with some embodiments.

FIG. 13 illustrates the channel layer 702 formed over the one or more second dielectric layers 302 and the gates 408, according to some embodiments. The channel layer 702 at least one of overlies the one or more second dielectric layers 302, is in direct contact with a top surface of the one or more second dielectric layers 302, or is in indirect contact with the top surface of the one or more second dielectric layers 302. In some embodiments, one or more layers, such as a buffer layer, are between the channel layer 702 and the one or more second dielectric layers 302. At least one of one or more portions of the channel layer 702 or one or more portions of the one or more second dielectric layers 302 are removed, such as using one or more of the techniques shown in and/or described with respect to FIG. 8. Other processes and/or techniques for removing the one or more portions of the channel layer 702 and/or the one or more portions of the one or more second dielectric layers 302 are within the scope of the present disclosure. In some embodiments, the one or more portions of the channel layer 702 overlie the one or more portions of the one or more second dielectric layers 302. In some embodiments, the one or more portions of the channel layer 702 and the one or more portions of the one or more second dielectric layers 302 overlie an inactive region of the memory array structure 1100, such as a region that does not comprise one, some and/or all gates 408 of the memory array structure 1100. In some embodiments, the one or more portions of the channel layer 702 and the one or more portions of the one or more second dielectric layers 302 are laterally offset from one, some and/or all gates 408 of the memory array structure 1100. In some embodiments, the one or more portions of the one or more second dielectric layers 302 comprise a portion 1202 and a portion 1204 of the one or more second dielectric layers (shown in FIG. 12).

Figure 14:
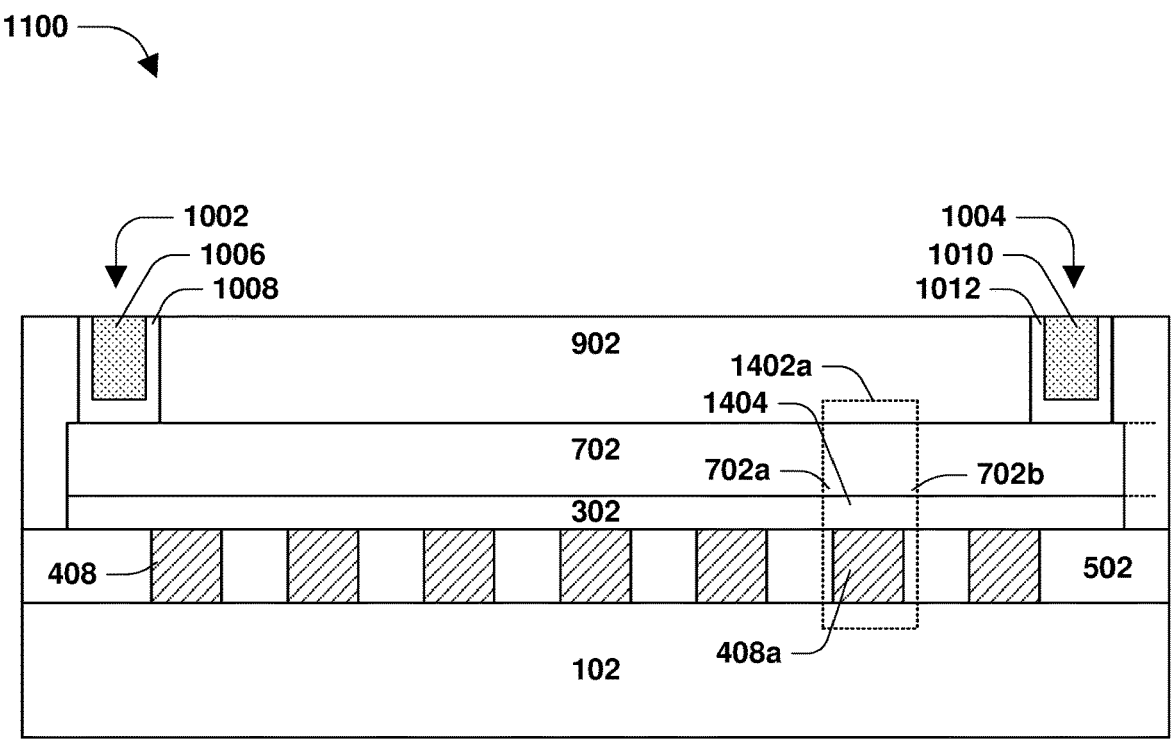
FIG. 14 illustrates a memory array structure at a stage of fabrication, in accordance with some embodiments.

FIG. 14 illustrates the fourth dielectric layer 902, the first contact 1002 and the second contact 1004 formed over at least one of the channel layer 702, the one or more second dielectric layers 302, or the gates 408, according to some embodiments. In some embodiments, the first contact 1002 and the second contact 1004 are embedded in the fourth dielectric layer 902. The fourth dielectric layer 902, the first contact 1002 and the second contact 1004 are formed using one or more of the techniques shown in and/or described with respect to FIGS. 9-10. Other processes and/or techniques for forming the fourth dielectric layer 902, the first contact 1002 and/or the second contact 1004 are within the scope of the present disclosure. The first contact 1002 at least one of overlies the channel layer 702, is in direct contact with the top surface of the channel layer 702, or is in indirect contact with the top surface of the channel layer 702. The second contact 1004 at least one of overlies the channel layer 702, is in direct contact with the top surface of the channel layer 702, or is in indirect contact with the top surface of the channel layer 702. Other structures and/or configurations of the first contact 1002 and/or the second contact 1004 relative to other elements, features, etc. are within the scope of the present disclosure.

In some embodiments, the memory array structure 1100 comprises a memory array, such as a non-volatile memory array. In some embodiments, the memory array is a flash memory array, such as a memory array that can be operated as at least one of NAND flash or NOR flash. The memory array comprises a plurality of memory cells 1402 comprising a memory cell 1402a. The memory cell 1402a comprises the gate 408a, such as a control gate of the memory cell 1402a, a charge storing component, and a portion of the channel layer 702. The charge storing component comprises a portion 1404 of the one or more second dielectric layers 302. In some embodiments, the portion 1404 of the one or more second dielectric layers 302 overlies the gate 408a. In some embodiments, the portion 1404 of the one or more second dielectric layers 302 separates the gate 408a from the channel layer 702. In some embodiments, the memory cell 1402a comprises a transistor, such as a thin film transistor or other suitable transistor, wherein the transistor comprises at least one of the gate 408a, the first portion 702a of the channel layer 702 corresponding to a source of the transistor, the second portion 702b of the channel layer 702 corresponding to a drain of the transistor, or the charge storing component comprising the portion 1404 of the one or more second dielectric layers 302, wherein a threshold voltage of the transistor is based upon a charge stored in the charge storing component. In some embodiments, the charge storing component of the memory cell 1402a is not spatially and/or structurally isolated from charge storing components of other memory cells of the plurality of memory cells 1402, wherein the charge storing components of the other memory cells comprise other portions of the one or more second dielectric layers 302.

Figure 15:
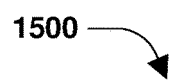
FIG. 15 illustrates a memory array structure at a stage of fabrication, in accordance with some embodiments.
Figure 16:
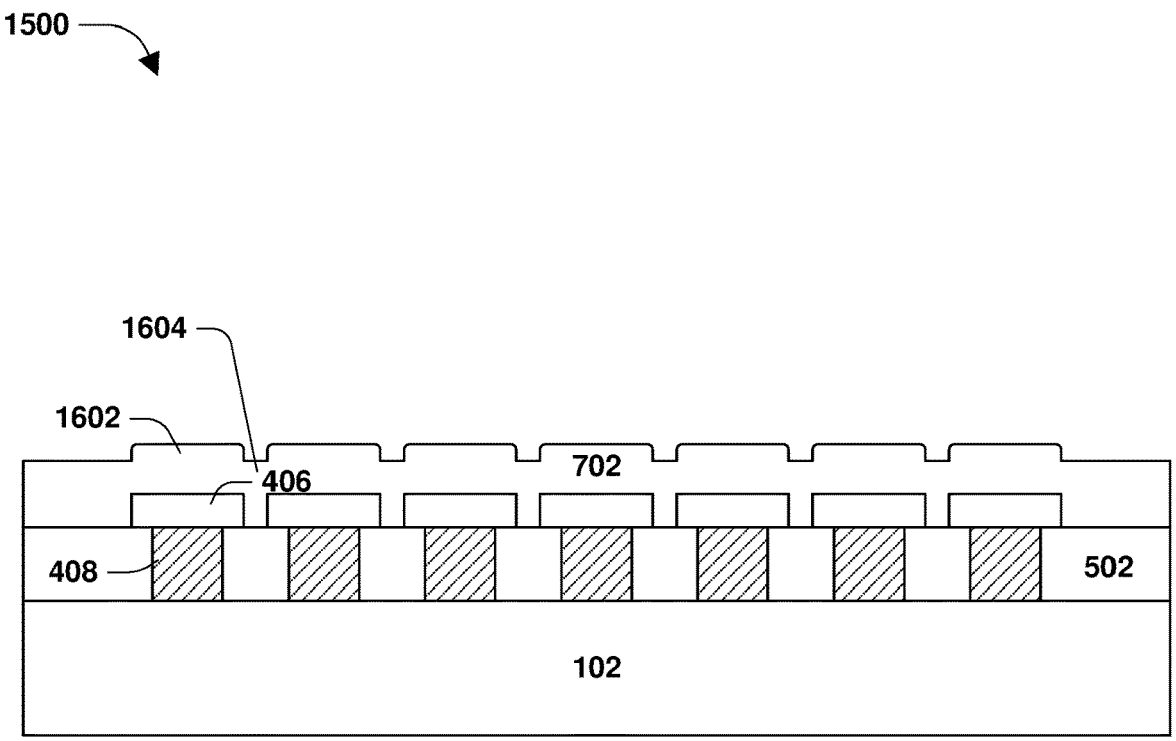
FIG. 16 illustrates a memory array structure at a stage of fabrication, in accordance with some embodiments.
Figure 17:
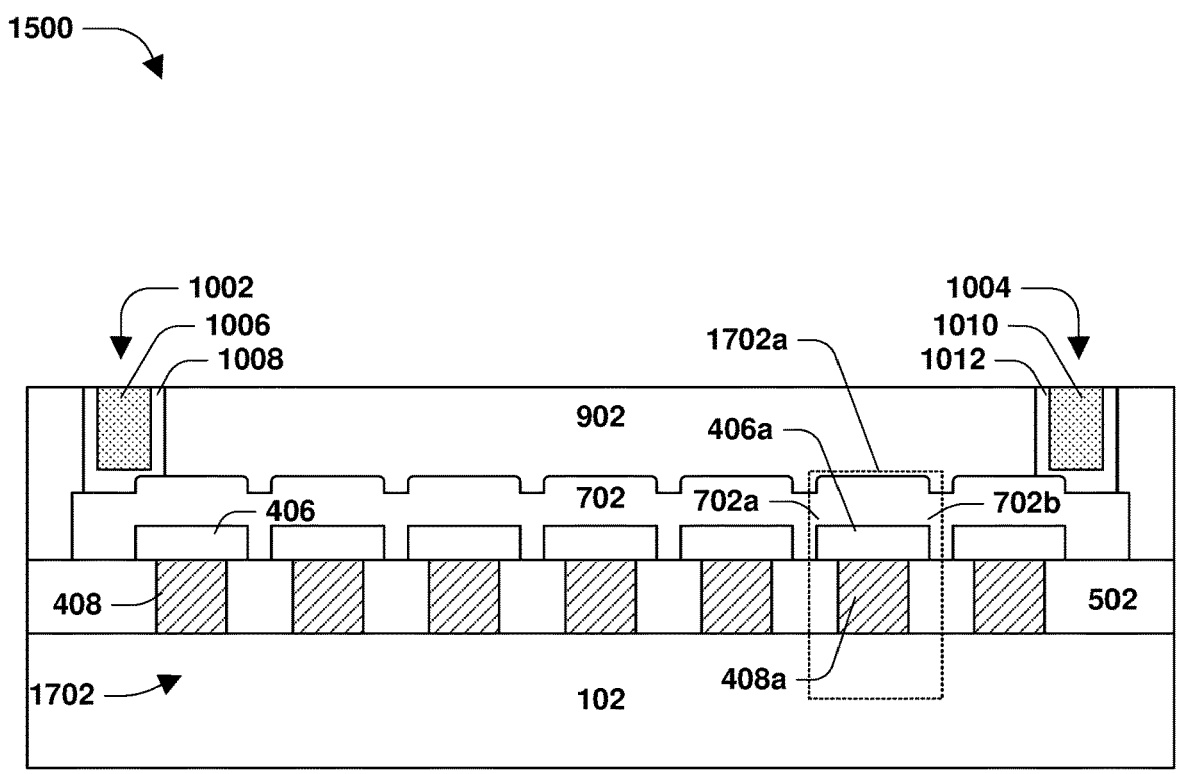
FIG. 17 illustrates a memory array structure at a stage of fabrication, in accordance with some embodiments.

FIGS. 15-17 illustrate a memory array structure 1500 at various stages of fabrication, in accordance with some embodiments. A semiconductor device, such as at least one of a logic chip, a memory chip, etc., comprises the memory array structure 1500. The semiconductor device is configured for at least one of processing data or memory storage. Other structures and/or configurations of the memory array structure 1500 and/or the semiconductor device are within the scope of the present disclosure.

FIG. 15 illustrates the memory array structure 1500 according to some embodiments. In some embodiments, the memory array structure 1500 comprises the first dielectric layer 102, the third dielectric layer 502, gates 408 and charge storing components 406. In some embodiments, the gates 408 are embedded in the third dielectric layer 502. In some embodiments, the arrangement of the memory array structure 1500 shown in FIG. 15 is formed from the arrangement of the memory array structure 1100 shown in FIG. 11 by patterning the one or more second dielectric layers 302 to form the charge storing components 406. Other processes and/or techniques for forming the arrangement of the memory array structure 1500 shown in FIG. 15 are within the scope of the present disclosure. In some embodiments, since the charge storing components 406 are formed separately from the gates 408, sidewalls of the charge storing components 406 are not aligned with sidewalls of the gates 408.

FIG. 16 illustrates the channel layer 702 formed over the charge storing components 406, the gates 408 and the third dielectric layer 502, according to some embodiments. The channel layer 702 at least one of overlies the third dielectric layer 502, is in direct contact with a top surface of the third dielectric layer 502, or is in indirect contact with the top surface of the third dielectric layer 502. The channel layer 702 at least one of overlies one, some and/or all charge storing components of the charge storing components 406, is in direct contact with top surfaces of one, some and/or all charge storing components of the charge storing components 406, or is in indirect contact with the top surfaces of one, some and/or all charge storing components of the charge storing components 406. In some embodiments, one or more layers, such as a buffer layer, are between the channel layer 702 and at least one of the third dielectric layer 502 or one, some and/or all charge storing components of the charge storing components 406. In some embodiments, a top surface of a portion 1602 of the channel layer 702 that overlies a charge storing component 406 is over a top surface of a portion 1604 of the channel layer 702 that is laterally offset from the charge storing component 1406. In some embodiments, the top surface of the channel layer 702 is planarized (not shown) by at least one of CMP, etching, or other suitable techniques. Other structures and/or configurations of the channel layer 702 are within the scope of the present disclosure.

FIG. 17 illustrates the fourth dielectric layer 902, the first contact 1002 and the second contact 1004 formed over at least one of the channel layer 702, the charge storing components 406, or the gates 408, according to some embodiments. In some embodiments, the first contact 1002 and the second contact 1004 are embedded in the fourth dielectric layer 902. The fourth dielectric layer 902, the first contact 1002 and the second contact 1004 are formed using one or more of the techniques shown in and/or described with respect to FIGS. 9-10. Other processes and/or techniques for forming the fourth dielectric layer 902, the first contact 1002 and/or the second contact 1004 are within the scope of the present disclosure. The first contact 1002 at least one of overlies the channel layer 702, is in direct contact with the top surface of the channel layer 702, or is in indirect contact with the top surface of the channel layer 702. The second contact 1004 at least one of overlies the channel layer 702, is in direct contact with the top surface of the channel layer 702, or is in indirect contact with the top surface of the channel layer 702. Other structures and/or configurations of the first contact 1002 and/or the second contact 1004 relative to other elements, features, etc. are within the scope of the present disclosure.

In some embodiments, one or more portions of the channel layer 702 are removed, such as using one or more of the techniques shown in and/or described with respect to FIG. 8. In some embodiments, the one or more portions of the channel layer 702 overlie an inactive region of the memory array structure 1100, such as a region that does not comprise the gates 408. In some embodiments, the one or more portions of the channel layer 702 are laterally offset from one, some and/or all gates 408 of the memory array structure 1500. In some embodiments, the one or more portions of the one or more second dielectric layer 302 are removed prior to forming the fourth dielectric layer 902, the first contact 1002 and the second contact 1004.

In some embodiments, the memory array structure 1500 comprises a memory array, such as a non-volatile memory array. In some embodiments, the memory array is a flash memory array, such as a memory array that can be operated as at least one of NAND flash or NOR flash. The memory array comprises a plurality of memory cells 1702 comprising a memory cell 1702a. The memory cell 1702a comprises the gate 408a, such as a control gate of the memory cell 1702a, the charge storing component 406a, and a portion of the channel layer 702. In some embodiments, the memory cell 1702a comprises a transistor, such as a thin film transistor or other suitable transistor, wherein the transistor comprises at least one of the gate 408a, the first portion 702a of the channel layer 702 corresponding to a source of the transistor, the second portion 702b of the channel layer 702 corresponding to a drain of the transistor, or the charge storing component 406a, wherein a threshold voltage of the transistor is based upon a charge stored in the charge storing component 406a.

FIGS. 18-23 illustrate a memory array structure 1800 at various stages of fabrication, in accordance with some embodiments. A semiconductor device, such as at least one of a logic chip, a memory chip, etc., comprises the memory array structure 1800. The semiconductor device is configured for at least one of processing data or memory storage. Other structures and/or configurations of the memory array structure 1800 and/or the semiconductor device are within the scope of the present disclosure.

Figure 18:
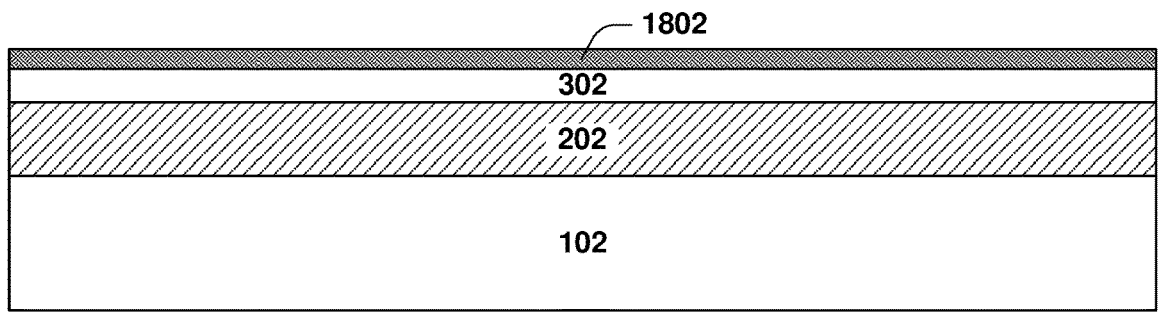
FIG. 18 illustrates a memory array structure at a stage of fabrication, in accordance with some embodiments.

FIG. 18 illustrates the memory array structure 1800 according to some embodiments. In some embodiments, the memory array structure 1800 comprises the first dielectric layer 102, the gate layer 202, the one or more second dielectric layers 302, and a sacrificial layer 1802. In some embodiments, the arrangement of the memory array structure 1800 shown in FIG. 18 is formed from the arrangement of the memory array structure 100 shown in FIG. 3A by forming the sacrificial layer 1802 over the one or more second dielectric layers 302. Other processes and/or techniques for forming the arrangement of the memory array structure 1800 shown in FIG. 18 are within the scope of the present disclosure. The sacrificial layer 1802 is formed by at least one of PVD, sputtering, CVD, LPCVD, ALCVD, UHVCVD, RPCVD, ALD, MBE, LPE, spin on, growth, or other suitable techniques.

The sacrificial layer 1802 at least one of overlies the one or more second dielectric layers 302, is in direct contact with a top surface of the one or more second dielectric layers 302, or is in indirect contact with the top surface of the one or more second dielectric layers 302. In some embodiments, one or more layers, such as a buffer layer, are between the sacrificial layer 1802 and the one or more second dielectric layers 302. In some embodiments, the sacrificial layer 1802 comprises a metal. Other structures and/or configurations of the sacrificial layer 1802 are within the scope of the present disclosure.

Figure 19:
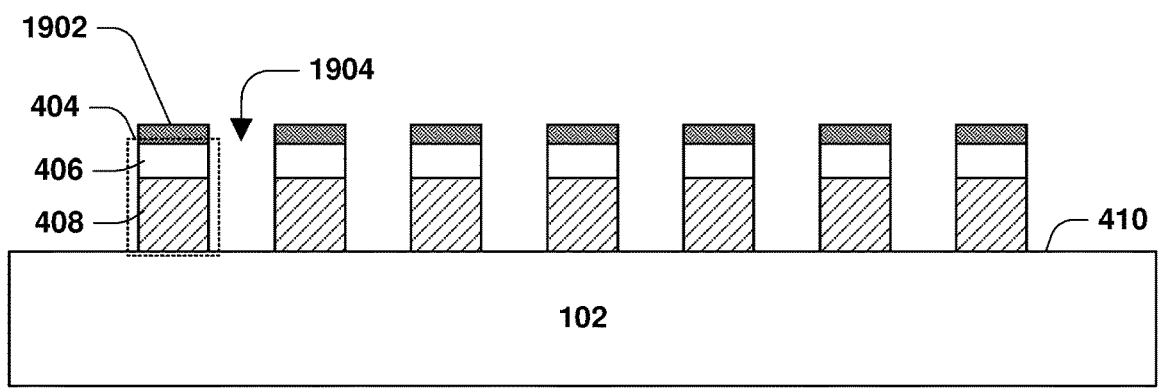
FIG. 19 illustrates a memory array structure at a stage of fabrication, in accordance with some embodiments.

FIG. 19 illustrates gate-and-charge storing components 404 formed from the gate layer 202 and the one or more second dielectric layers 302 and sacrificial elements 1902 formed from the sacrificial layer 1802, according to some embodiments. In some embodiments, the gate layer 202, the one or more second dielectric layers 302 and the sacrificial layer 1802 are patterned to form the gate-and-charge storing components 404 and the sacrificial elements 1902 overlying the gate-and-charge storing components 404, such as by removing portions of the gate layer 202, the one or more second dielectric layers 302 and the sacrificial layer 1802 to form openings 1904 through the one or more second dielectric layers 302 and the gate layer 202. In some embodiments, the openings 1904 expose portions of the top surface 410 of the first dielectric layer 102. In some embodiments, at least one of the gate-and-charge storing components 404 or the sacrificial elements 1902 are formed using one or more of the techniques shown in and/or described with respect to FIG. 4.

Figure 20:
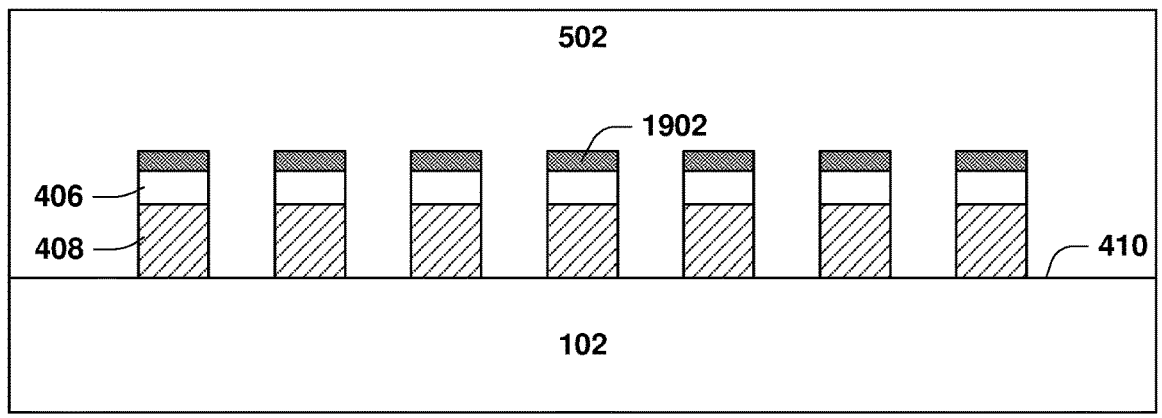
FIG. 20 illustrates a memory array structure at a stage of fabrication, in accordance with some embodiments.

FIG. 20 illustrates the third dielectric layer 502 formed over at least one of the first dielectric layer 102, the gate-and-charge storing components 404, or the sacrificial elements 1902, according to some embodiments. The third dielectric layer 502 at least one of overlies the sacrificial elements 1902, is in direct contact with top surfaces and/or sidewalls of the sacrificial elements 1902, or is in indirect contact with top surfaces and/or sidewalls of the sacrificial elements 1902. Other structures and/or configurations of the third dielectric layer 502 are within the scope of the present disclosure.

Figure 21:
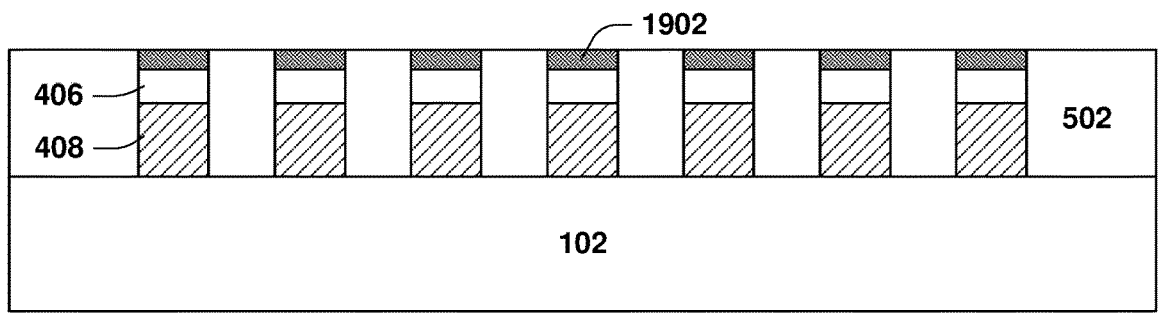
FIG. 21 illustrates a memory array structure at a stage of fabrication, in accordance with some embodiments.

FIG. 21 illustrates removal of a portion of the third dielectric layer 502, according to some embodiments. The portion of the third dielectric layer 502 is removed by at least one of CMP, etching, or other suitable techniques. In some embodiments, removal of the portion of the third dielectric layer 502 exposes top surfaces of one, some and/or all sacrificial elements of the sacrificial elements 1902. In some embodiments, a top surface of a sacrificial element 1902 is level or coplanar with a top surface of the third dielectric layer 502. In some embodiments, the sacrificial elements 1902 prevent and/or mitigate damage to charge storing components 406 and/or gates 408 underlying the sacrificial elements 1902 during one or more processing acts, such as a processing act comprising removing the portion of the third dielectric layer 502 by at least one of CMP, etching, or other suitable techniques.

Figure 22:
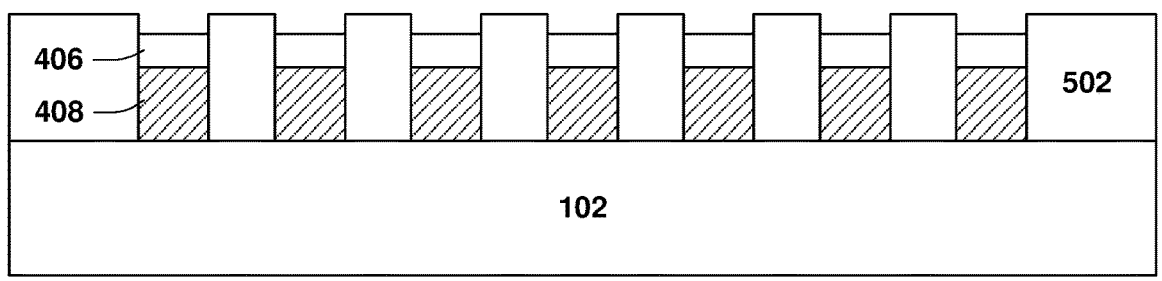
FIG. 22 illustrates a memory array structure at a stage of fabrication, in accordance with some embodiments.

FIG. 22 illustrates removal of the sacrificial elements 1902, according to some embodiments. In some embodiments, the sacrificial elements 1902 are removed by at least one of CMP, etching, or other suitable techniques. In some embodiments, an etching process is used to remove the sacrificial elements 1902, wherein one or more etchants used in the etching process have a selectivity such that the one or more etchants remove or etch away the sacrificial elements 1902 at a greater rate than the one or more etchants remove or etch away other parts of the memory array structure 1800. The etching process is at least one of a dry etching process, a wet etching process, an anisotropic etching process, an isotropic etching process, or other suitable etching process. Other processes and/or techniques for removing the sacrificial elements 1902 are within the scope of the present disclosure.

Figure 23:
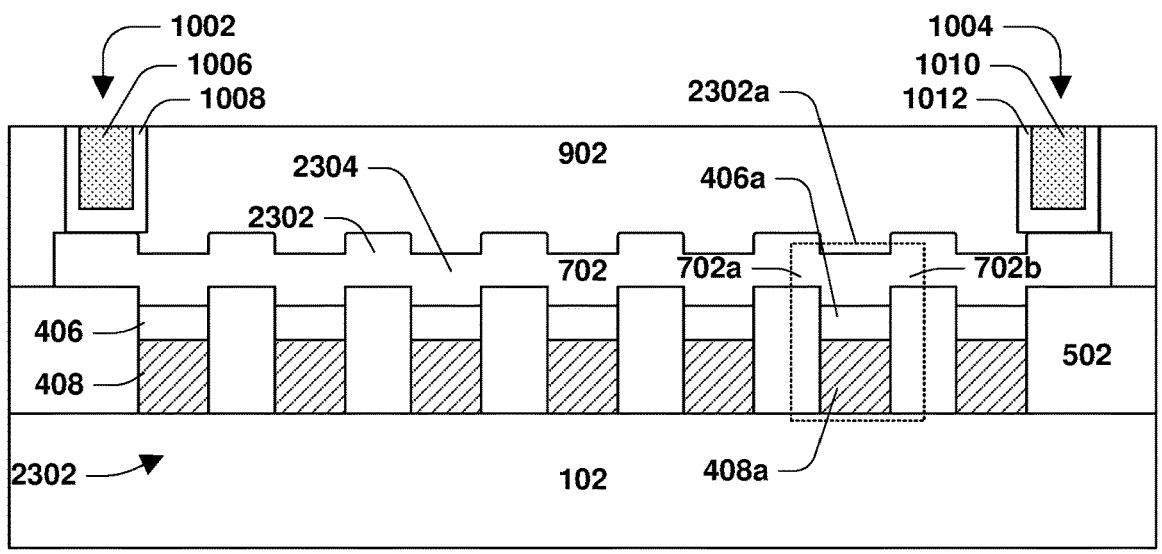
FIG. 23 illustrates a memory array structure at a stage of fabrication, in accordance with some embodiments.

FIG. 23 illustrates the channel layer 702, the fourth dielectric layer 902, the first contact 1002 and the second contact 1004 formed over the charge storing components 406, the gates 408 and the third dielectric layer 502, according to some embodiments. The channel layer 702 at least one of overlies the third dielectric layer 502, is in direct contact with a top surface of the third dielectric layer 502, or is in indirect contact with the top surface of the third dielectric layer 502. The channel layer 702 at least one of overlies one, some and/or all charge storing components of the charge storing components 406, is in direct contact with top surfaces of one, some and/or all charge storing components of the charge storing components 406, or is in indirect contact with the top surfaces of one, some and/or all charge storing components of the charge storing components 406. In some embodiments, one or more layers, such as a buffer layer, are between the channel layer 702 and at least one of the third dielectric layer 502 or one, some and/or all charge storing components of the charge storing components 406. In some embodiments, a top surface of a portion 2302 of the channel layer 702 that that is laterally offset from a charge storing component 1406 is over a top surface of a portion 2304 of the channel layer 702 that overlies the charge storing component 406. In some embodiments, the top surface of the channel layer 702 is planarized (not shown) by at least one of CMP, etching, or other suitable techniques.

In some embodiments, the first contact 1002 and the second contact 1004 are embedded in the fourth dielectric layer 902. In some embodiments, the fourth dielectric layer 902, the first contact 1002 and the second contact 1004 are formed using one or more of the techniques shown in and/or described with respect to FIGS. 9-10. Other processes and/or techniques for forming the fourth dielectric layer 902, the first contact 1002, and/or the second contact 1004 are within the scope of the present disclosure. The first contact 1002 at least one of overlies the channel layer 702, is in direct contact with the top surface of the channel layer 702, or is in indirect contact with the top surface of the channel layer 702. The second contact 1004 at least one of overlies the channel layer 702, is in direct contact with the top surface of the channel layer 702, or is in indirect contact with the top surface of the channel layer 702.

In some embodiments, one or more portions of the channel layer 702 are removed, such as using one or more of the techniques shown in and/or described with respect to FIG. 8. In some embodiments, the one or more portions of the channel layer 702 overlie an inactive region of the memory array structure 1800, such as a region that does not comprise the gates 408. In some embodiments, the one or more portions of the channel layer 702 are laterally offset from one, some and/or all gates 408 of the memory array structure 1800. In some embodiments, the one or more portions of the one or more second dielectric layer 302 are removed prior to forming the fourth dielectric layer 902, the first contact 1002 and the second contact 1004.

In some embodiments, the memory array structure 1800 comprises a memory array, such as a non-volatile memory array. In some embodiments, the memory array is a flash memory array, such as a memory array that can be operated as at least one of NAND flash or NOR flash. The memory array comprises a plurality of memory cells 2302 comprising a memory cell 2302a. The memory cell 2302a comprises the gate 408a, such as a control gate of the memory cell 2302a, the charge storing component 406a, and a portion of the channel layer 702. In some embodiments, the memory cell 2302a comprises a transistor, such as a thin film transistor or other suitable transistor, wherein the transistor comprises at least one of the gate 408a, the first portion 702a of the channel layer 702 corresponding to a source of the transistor, the second portion 702b of the channel layer 702 corresponding to a drain of the transistor, or the charge storing component 406a, wherein a threshold voltage of the transistor is based upon a charge stored in the charge storing component 406a.

Figure 24:
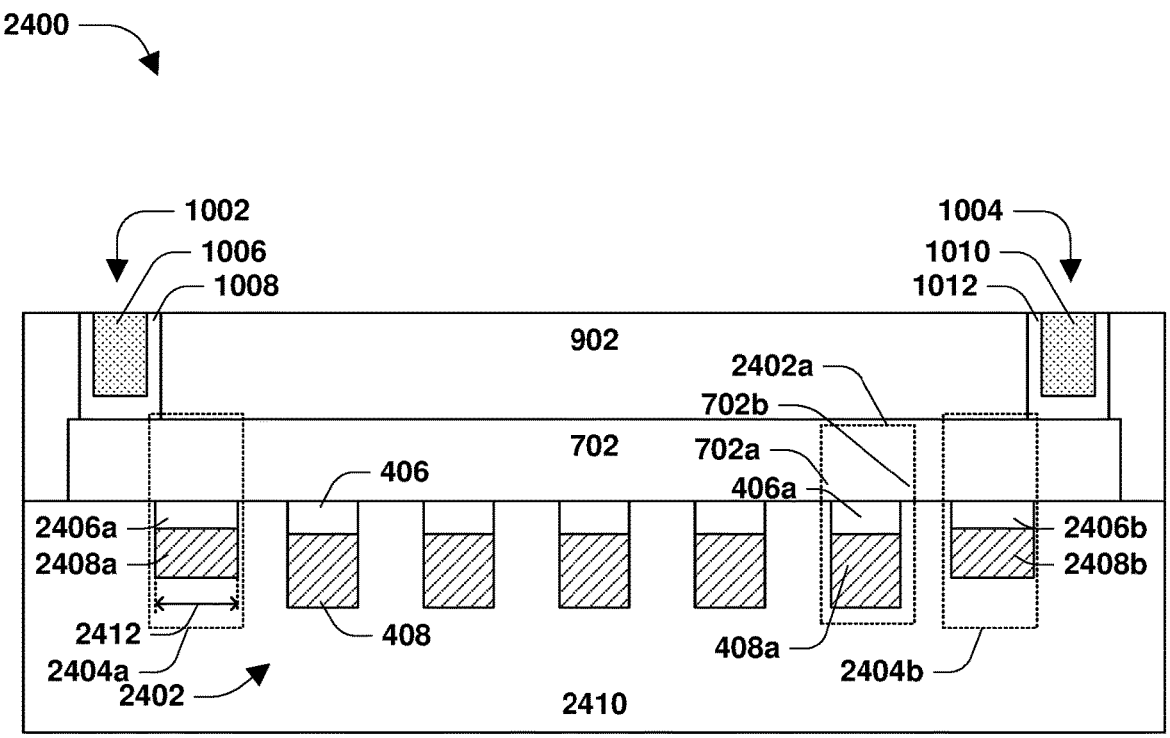
FIG. 24 illustrates a memory array structure, in accordance with some embodiments.

In some embodiments, a memory array provided herein, such as at least one of the memory array of the memory array structure 100, the memory array of the memory array structure 1100, the memory array of the memory array structure 1500, the memory array of the memory array structure 1800, or other memory array provided herein, comprises one or more access transistors. In some embodiments, the one or more access transistors are laterally offset from memory cells of the memory array. In some embodiments, one, some and/or all memory cells of the memory array are between two access transistors of the one or more access transistors. FIG. 24 illustrates a memory array structure 2400 according to some embodiments. In some embodiments, the memory array structure 2400 comprises a memory array, such as a non-volatile memory array. In some embodiments, the memory array is a flash memory array, such as a memory array that can be operated as at least one of NAND flash or NOR flash. The memory array comprises a plurality of memory cells 2402 comprising a memory cell 2402a. The memory cell 2402a comprises the gate 408a, such as a control gate of the memory cell 2402a, the charge storing component 406a, and a portion of the channel layer 702. In some embodiments, the memory cell 2402a comprises a transistor, such as a thin film transistor or other suitable transistor, wherein the transistor comprises at least one of the gate 408a, the first portion 702a of the channel layer 702 corresponding to a source of the transistor, the second portion 702b of the channel layer 702 corresponding to a drain of the transistor, or the charge storing component 406a, wherein a threshold voltage of the transistor is based upon a charge stored in the charge storing component 406a. In some embodiments, gate-and-charge storing components 404 of one, some and/or all memory cells of the plurality of memory cells 2402 are embedded in one or more dielectric layers 2410. In some embodiments, the one or more dielectric layers 2410 comprise at least one of the first dielectric layer 102 or the third dielectric layer 502. In some embodiments, the one or more dielectric layers 2410 are one or more interlayer dielectric layers.

In some embodiments, the memory array of the memory array structure 2400 comprises access transistors 2404 comprising a first access transistor 2404a and a second access transistor 2404b. In some embodiments, the first access transistor 2404a comprises a first access gate 2408a, a first dielectric component 2406a and a portion of the channel layer 702. The first dielectric component 2406a is between the first access gate 2408a and the channel layer 702. The first dielectric component 2406a at least one of underlies the channel layer 702, is in direct contact with the channel layer 702 or is in indirect contact with the channel layer 702. In some embodiments, the first access gate 2408a comprises a metal. The first access gate 2408a comprises at least one of titanium, tungsten, nitride, such as titanium nitride (TiN), or other suitable material. In some embodiments, the first dielectric component 2406a comprises a high-k dielectric material. The high-k dielectric material may be any suitable material. In some embodiments, the first dielectric component 2406a comprises oxide, such as a high-k oxide. In some embodiments, the first dielectric component 2406a comprises at least one of hafnium dioxide ($HfO_2$) or other suitable material. Other structures and/or configurations of the first access transistor 2404a are within the scope of the present disclosure.

In some embodiments, the second access transistor 2404b comprises a second access gate 2408b, a second dielectric component 2406b and a portion of the channel layer 702. The second dielectric component 2406b is between the second access gate 2408b and the channel layer 702. The second dielectric component 2406b at least one of underlies the channel layer 702, is in direct contact with the channel layer 702 or is in indirect contact with the channel layer 702. In some embodiments, the second access gate 2408b comprises a metal. The second access gate 2408b comprises at least one of titanium, tungsten, nitride, such as titanium nitride (TiN), or other suitable material. In some embodiments, the second dielectric component 2406b comprises a high-k dielectric material. The high-k dielectric material may be any suitable material. In some embodiments, the second dielectric component 2406b comprises oxide, such as a high-k oxide. In some embodiments, the second dielectric component 2406b comprises at least one of hafnium dioxide ($HfO_2$) or other suitable material. Other structures and/or configurations of the first access transistor 2404a are within the scope of the present disclosure.

In some embodiments, a length 2412 of a gate of an access transistor, such as at least one of the first access gate 2408a or the second access gate 2408b, is larger than a length of a gate 408 of a memory cell of the plurality of memory cells 2402 to prevent and/or mitigate leakage current from the access transistor.

In some embodiments, the plurality of memory cells 2402 is between the first access transistor 2404a and the second access transistor 2404b. In some embodiments, the access transistors 2404 control access to memory stored on the plurality of memory cells 2402.

In some embodiments, instead of the access transistors 2404 being positioned within the memory array, such as shown in FIG. 24, the access transistors 2404 can be positioned outside of the memory array.

Figure 25:
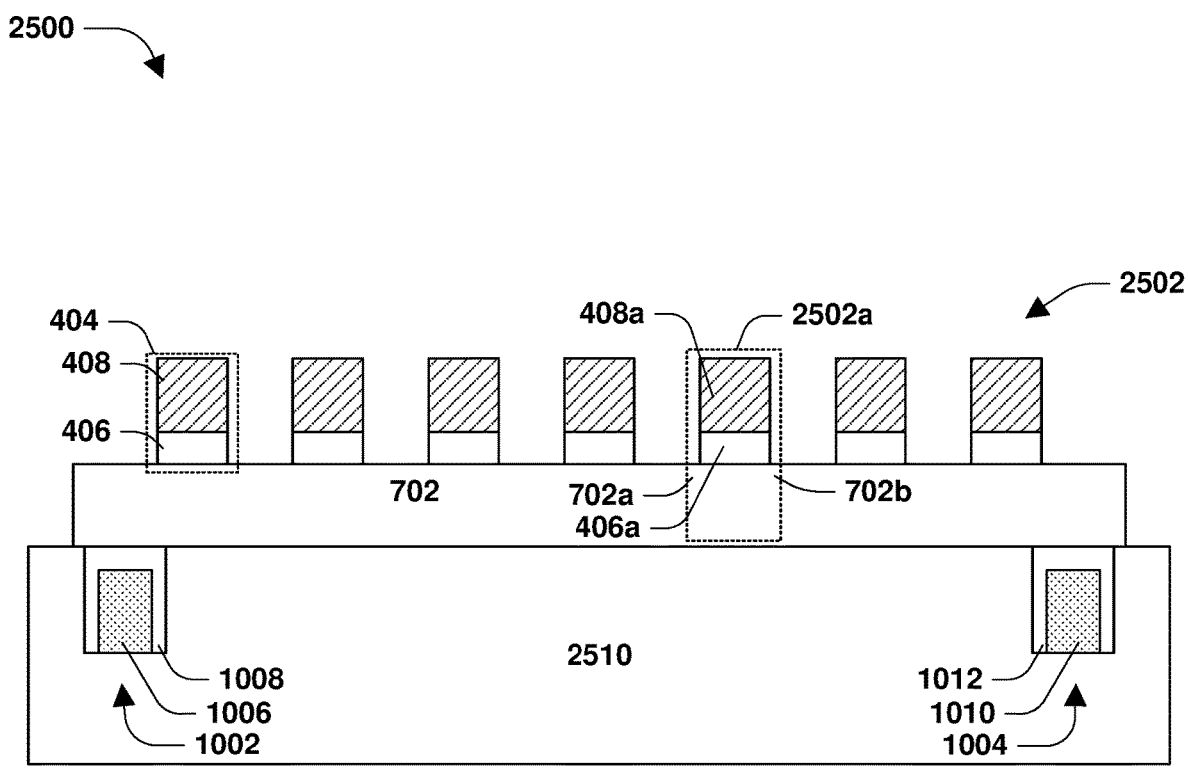
FIG. 25 illustrates a memory array structure, in accordance with some embodiments.

In some embodiments, gate-and-charge storing components 404 of a memory array provided herein overlie the channel layer 702. FIG. 25 illustrates a memory array structure 2500 according to some embodiments. In some embodiments, the memory array structure 2500 comprises a memory array, such as a non-volatile memory array. In some embodiments, the memory array is a flash memory array, such as a memory array that can be operated as at least one of NAND flash or NOR flash. The memory array comprises a plurality of memory cells 2502 comprising a memory cell 2502a. The memory cell 2502a comprises the gate 408a, such as a control gate of the memory cell 2502a, the charge storing component 406a, and a portion of the channel layer 702. In some embodiments, the memory cell 2502a comprises a transistor, such as a thin film transistor or other suitable transistor, wherein the transistor comprises at least one of the gate 408a, the first portion 702a of the channel layer 702 corresponding to a source of the transistor, the second portion 702b of the channel layer 702 corresponding to a drain of the transistor, or the charge storing component 406a, wherein a threshold voltage of the transistor is based upon a charge stored in the charge storing component 406a. In some embodiments, gate-and-charge storing components 404 of one, some and/or all memory cells of the plurality of memory cells 2502 overlie the channel layer 702, such as where the gate 408a and the charge storing component 406a overlie the channel layer 702, wherein the charge storing component 406a is between the channel layer 702 and the gate 408a.

The gate-and-charge storing components 404 are formed using one or more of the techniques shown in and/or described with respect to FIGS. 2-4. The one or more second dielectric layers 302 are formed over the channel layer 702, the gate layer 202 is formed over the one or more second dielectric layers 302, and the gate-and-charge storing components 404 are formed from the gate layer 202 and the one or more second dielectric layers 302, such as by patterning the gate layer 202 and the one or more second dielectric layers 302. Other processes and/or techniques for forming the gate-and-charge storing components 404 are within the scope of the present disclosure.

In some embodiments, at least one of the first contact 1002 or the second contact 1004 underlie the channel layer 702. A top surface of the first contact 1002 at least one of is in direct contact with the channel layer 702 or is in indirect contact with the channel layer 702. A top surface of the second contact 1004 at least one of is in direct contact with the channel layer 702 or is in indirect contact with the channel layer 702. In some embodiments, at least one of the first contact 1002 or the second contact 1004 is embedded in one or more dielectric layers 2510. In some embodiments, the one or more dielectric layers 2510 comprise at least one of the first dielectric layer 102 or the third dielectric layer 502. In some embodiments, the one or more dielectric layers 2510 are one or more interlayer dielectric layers. The first contact 1002 and the second contact 1004 are formed using one or more of the techniques shown in and/or described with respect to FIGS. 9-10. Portions of the one or more dielectric layers 2510 are removed to form trenches in the one or more dielectric layers 2510, and the first contact 1002 and the second contact 1004 are formed in the trenches. Other processes and/or techniques for forming the first contact 1002 and/or the second contact 1004 are within the scope of the present disclosure.

Figure 26A:
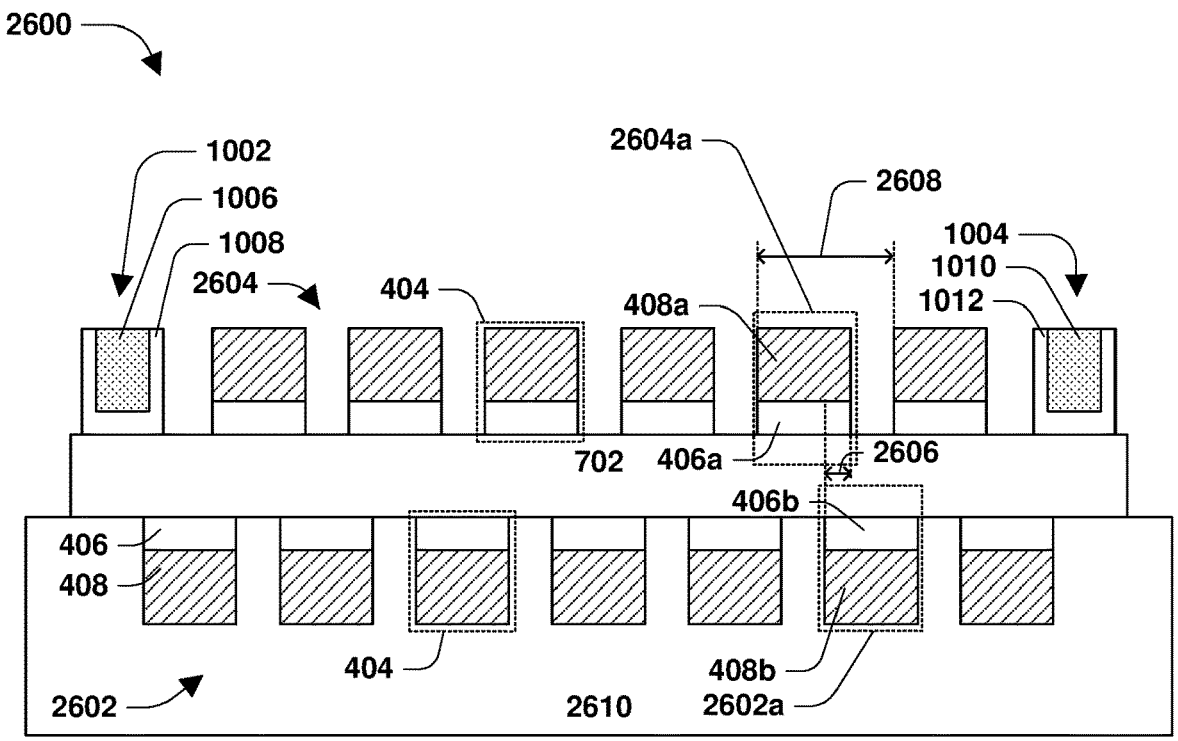
FIGS. 26A-26B illustrate a memory array structure, in accordance with some embodiments.
Figure 26B:
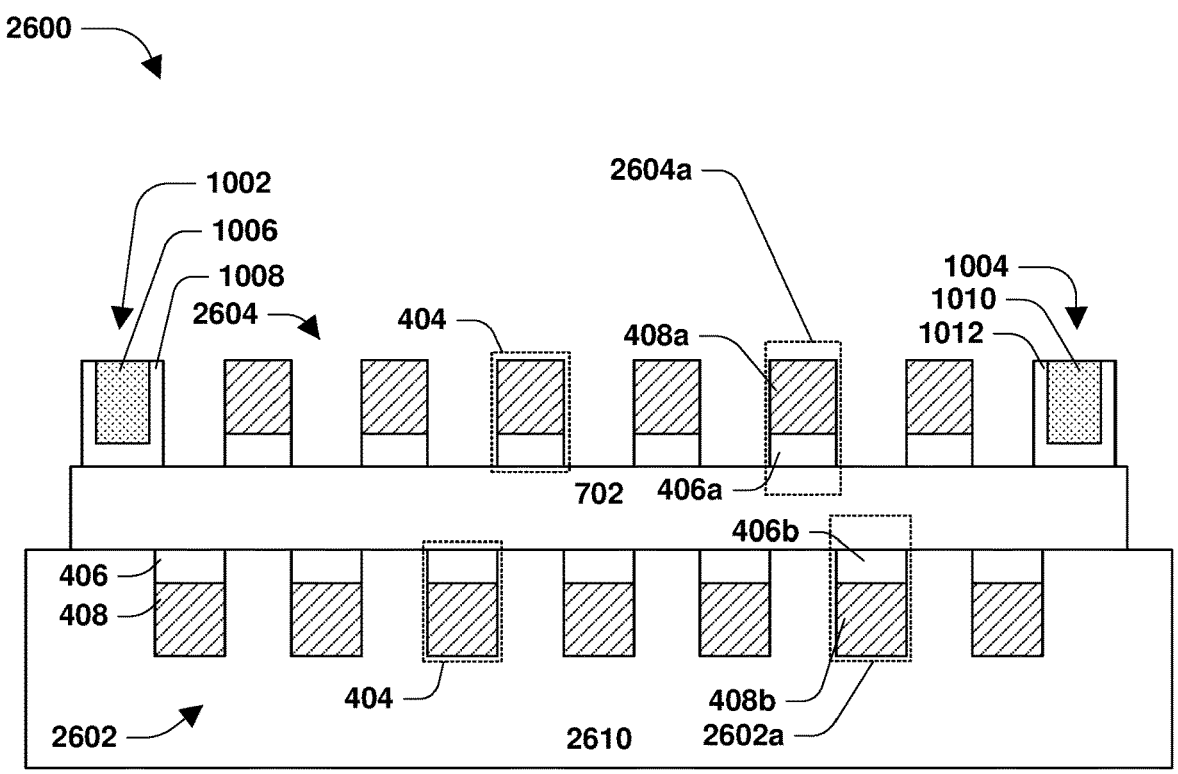

In some embodiments, gate-and-charge storing components 404 of a memory array provided herein comprise a first set of gate-and-charge storing components overlying the channel layer 702 and a second set of gate-and-charge storing components underlying the channel layer 702. FIGS. 26A-26B illustrate a memory array structure 2600 according to some embodiments. In some embodiments, the memory array structure 2600 comprises a memory array, such as a non-volatile memory array. In some embodiments, the memory array is a flash memory array, such as a memory array that can be operated as at least one of NAND flash or NOR flash. The memory array comprises a plurality of memory cells comprising a first set of memory cells 2604 and a second set of memory cells 2602. The first set of memory cells 2604 comprises a memory cell 2604a. The memory cell 2604a comprises the gate 408a, such as a control gate of the memory cell 2604a, the charge storing component 406a, and a portion of the channel layer 702. In some embodiments, the memory cell 2604a comprises a transistor, such as a thin film transistor or other suitable transistor, wherein the transistor comprises at least one of the gate 408a, a portion of the channel layer 702 corresponding to a source of the transistor, a portion of the channel layer 702 corresponding to a drain of the transistor, or the charge storing component 406a, wherein a threshold voltage of the transistor is based upon a charge stored in the charge storing component 406a. In some embodiments, gate-and-charge storing components 404 of one, some and/or all memory cells of the first set of memory cells 2604 overlie the channel layer 702, such as where the gate 408a and the charge storing component 406a overlie the channel layer 702, wherein the charge storing component 406a is between the channel layer 702 and the gate 408a.

The second set of memory cells 2602 comprises a memory cell 2602a. The memory cell 2602a comprises a gate 408b, such as a control gate of the memory cell 2602a, a charge storing component 406b, and a portion of the channel layer 702. In some embodiments, the memory cell 2602a comprises a transistor, such as a thin film transistor or other suitable transistor, wherein the transistor comprises at least one of a gate 408b, a portion of the channel layer 702 corresponding to a source of the transistor, a portion of the channel layer 702 corresponding to a drain of the transistor, or a charge storing component 406b, wherein a threshold voltage of the transistor is based upon a charge stored in the charge storing component 406b. In some embodiments, gate-and-charge storing components 404 of one, some and/or all memory cells of the second set of memory cells 2602 underlie the channel layer 702, such as where the gate 408b and the charge storing component 406b underlie the channel layer 702, wherein the charge storing component 406b is between the channel layer 702 and the gate 408b. In some embodiments, gate-and-charge storing components 404 of one, some and/or all memory cells of the second set of memory cells 2602 are embedded in one or more dielectric layers 2610. In some embodiments, the one or more dielectric layers 2610 comprise at least one of the first dielectric layer 102 or the third dielectric layer 502. In some embodiments, the one or more dielectric layers 2610 are one or more interlayer dielectric layers.

In some embodiments, gate-and-charge storing components 404 of at least one of the first set of memory cells 2604 or the second set of memory cells 2602 are formed using one or more of the techniques shown in and/or described with respect to FIGS. 2-4. In some embodiments, at least one of the plurality of memory cells of the memory array or the gate-and-charge storing components 404 of the plurality of memory cells are arranged in a zig-zag formation. In some embodiments, the memory array structure 2600 has a greater density of memory cells, such as about two times greater density of memory cells, as compared to memory array structures that merely comprise memory cells with gate-and-charge storing components 404 on one side of the channel layer 702. In some embodiments, at least one of dopant concentration or resistivity of the channel layer 702 in the memory array structure 2600 is regular across at least some of the channel layer 702, such as due to the plurality of memory cells comprising gate-and-charge storing components 404 on opposite sides of the channel layer 702 and/or due to the plurality of memory cells being arranged in the zig-zag formation. In some embodiments, at least one of dopant concentration or resistivity of the channel layer 702 in the memory array structure 2600 is required to be less irregular, such as having smaller differences in dopant concentration and/or resistivity, across at least some of the channel layer 702 as compared to memory array structures that merely comprise memory cells with gate-and-charge storing components 404 on one side of the channel layer 702, thereby providing for reduced complexity in forming and/or doping the channel layer 702.

In some embodiments, a gate of a memory cell of the first set of memory cells 2604 overlies a region between two adjacent memory cells of the second set of memory cells 2602. In some embodiments, as shown in FIG. 26A, a gate of a memory cell of the first set of memory cells 2604 overlies a gate of a memory cell of the second set of memory cells 2602, such as where a portion of the gate 408a of the memory cell 2604a of the first set of memory cells 2604 is vertically coincident with at least some of the gate 408b of the memory cell 2602a of the second set of memory cells 2602. In some embodiments, a length 2606 of the portion of the gate 408a of the memory cell 2604a that is vertically coincident with at least some of the gate 408b of the memory cell 2602a is between about 10% of a pitch 2608 of the gate 408a to about 40% of the pitch 2608 of the gate 408a, such as about 25% of the pitch 2608 of the gate 408a. The pitch 2608 of the gate 408a is between about 30 nanometers and about 80 nanometers. Other values of the length 2606 and/or the pitch 2608 are within the scope of the present disclosure.

In some embodiments, gates 408 of the first set of memory cells 2604 are laterally offset from gates 408 of the second set of memory cells 2604. In some embodiments, as shown in FIG. 26B, a gate of a memory cell of the first set of memory cells 2604 overlies a region between two adjacent memory cells of the second set of memory cells 2602, and the gate is not vertically coincident with a gate of a memory cell of the second set of memory cells 2602.

In some embodiments, a charge storing component of a memory array provided herein, such as at least one of the memory array of the memory array structure 100, the memory array of the memory array structure 1100, the memory array of the memory array structure 1500, the memory array of the memory array structure 1800, the memory array of the memory array structure 2400, the memory array of the memory array structure 2500, the memory array of the memory array structure 2600, or other memory array provided herein, comprises a dielectric trapping element for storing charge. In some embodiments, a memory array structure comprises a memory array with charge storing components comprising floating gates for storing charge, such as shown in FIGS. 27A-27B.

Figure 27A:
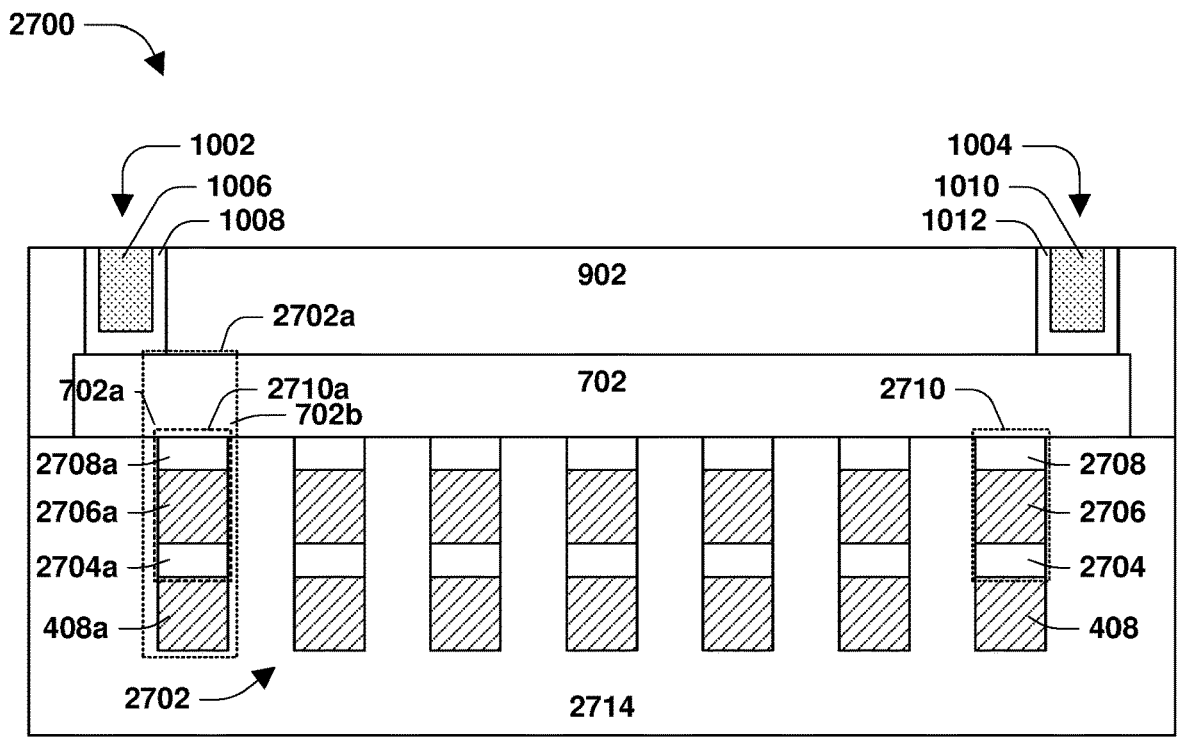
FIGS. 27A-27B illustrate a memory array structure, in accordance with some embodiments.
Figure 27B:
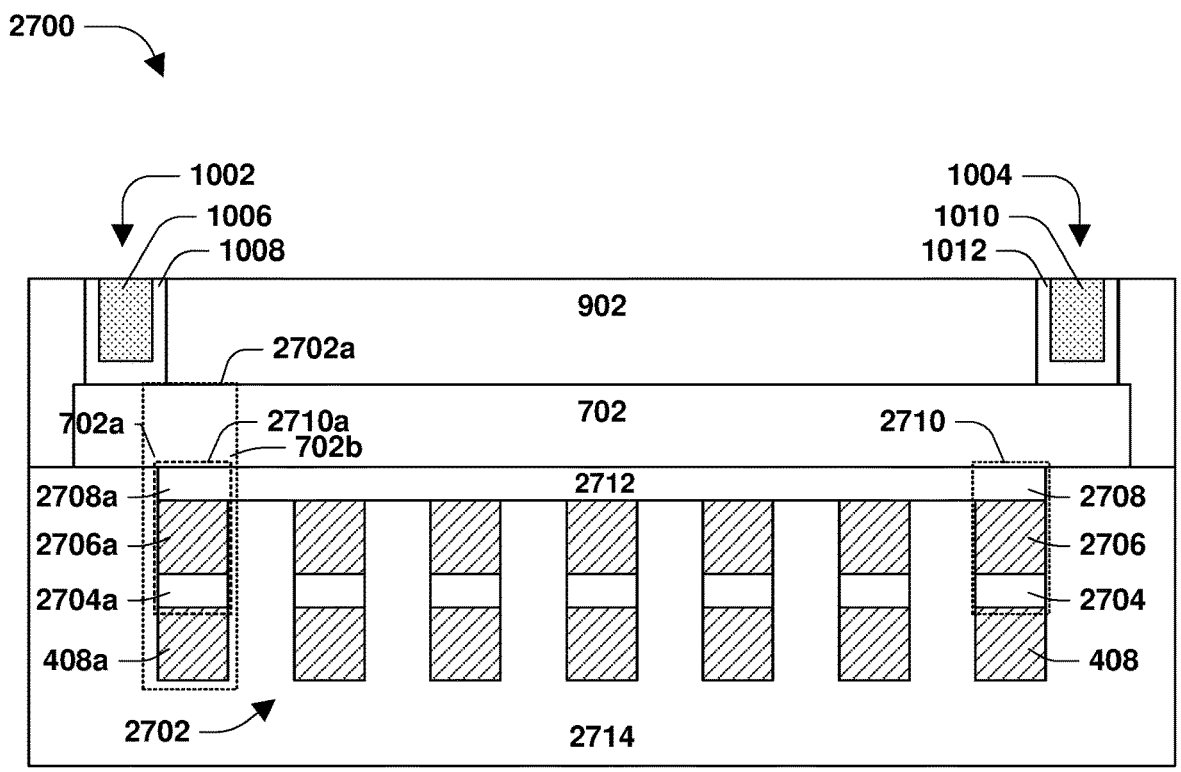

FIGS. 27A-27B illustrate a memory array structure 2700 according to some embodiments. In some embodiments, the memory array structure 2700 comprises a memory array, such as a non-volatile memory array. In some embodiments, the memory array is a flash memory array, such as a memory array that can be operated as at least one of NAND flash or NOR flash. The memory array comprises a plurality of memory cells 2702 comprising a memory cell 2702a. The memory cell 2702a comprises the gate 408a, such as a control gate of the memory cell 2502a, a charge storing component 2710a, and a portion of the channel layer 702. In some embodiments, the memory cell 2502a comprises a transistor, such as a thin film transistor or other suitable transistor, wherein the transistor comprises at least one of the gate 408a, the first portion 702a of the channel layer 702 corresponding to a source of the transistor, the second portion 702b of the channel layer 702 corresponding to a drain of the transistor, or the charge storing component 2710a, wherein a threshold voltage of the transistor is based upon a charge stored in the charge storing component 2710a.

In some embodiments, the charge is stored in a floating gate 2706a of the charge storing component 2710a. The charge storing component 2710a comprises at least one of a third dielectric component 2708a, the floating gate 2706a, or a fourth dielectric component 2704a. The third dielectric component 2708a at least one of overlies the floating gate 2706a, is in direct contact with a top surface of the floating gate 2706a, or is in indirect contact with the top surface of the floating gate 2706a. The floating gate 2706a at least one of overlies the fourth dielectric component 2704a, is in direct contact with a top surface of the fourth dielectric component 2704a, or is in indirect contact with the top surface of the fourth dielectric component 2704a. The fourth dielectric component 2704a at least one of overlies the gate 408a, is in direct contact with a top surface of the gate 408a, or is in indirect contact with the top surface of the gate 408a. In some embodiments, the third dielectric component 2708a comprises a high-k dielectric material. The high-k dielectric material may be any suitable material. In some embodiments, the third dielectric component 2708a comprises oxide, such as a high-k oxide. In some embodiments, the third dielectric component 2708a comprises at least one of hafnium dioxide ($HfO_2$) or other suitable material. The floating gate 2706a comprises at least one of titanium, tungsten, nitride, such as titanium nitride (TiN), or other suitable material. The fourth dielectric component 2704a comprises one or more dielectric layers, such as merely a single dielectric layer or an ONO tri-layer (not shown). In some embodiments, the ONO tri-layer of the fourth dielectric component 2704a comprises a third oxide layer, a second nitride layer and a fourth oxide layer. The second nitride layer at least one of overlies the third oxide layer, is in direct contact with a top surface of the third oxide layer, or is in indirect contact with the top surface of the third oxide layer. The fourth oxide layer at least one of overlies the second nitride layer, is in direct contact with a top surface of the second nitride layer, or is in indirect contact with the top surface of the second nitride layer. The third oxide layer comprises an oxide, such as silicon dioxide ($SiO_2$). The second nitride layer comprises a nitride, such as silicon nitride ($Si_3N_4$). The fourth oxide layer comprises an oxide, such as silicon dioxide ($SiO_2$). Other structures and/or configurations of the charge storing component 2710a are within the scope of the present disclosure.

In some embodiments, electrons are attracted to the charge storing component 2710a when a positive voltage is applied to the gate 408a. In some embodiments, electrons are repelled by the charge storing component 2710a when a negative voltage is applied to the gate 408a. In some embodiments, the transistor switches between a plurality of transistor states, such as two transistor states, associated with a plurality of threshold voltage levels of the transistor. In some embodiments, the transistor is in a third transistor state when a third amount of charge is stored in the charge storing component 2710a, wherein the third amount of charge is positive, negative, or zero, wherein the third transistor state is associated with the threshold voltage of the transistor being equal to a third threshold level of the plurality of threshold voltage levels. In some embodiments, the transistor is in a fourth transistor state when a fourth amount of charge is stored in the charge storing component 2710a, wherein the fourth amount of charge is different from the third amount of charge, wherein the fourth transistor state is associated with the threshold voltage of the transistor being equal to a fourth threshold level of the plurality of threshold voltage levels. In some embodiments, each memory cell of one, some and/or all memory cells of the plurality of memory cells 2702 of the memory array comprises a charge storing component 2710 comprising at least one of a third dielectric component 2708, a floating gate 2706, or a fourth dielectric component 2704, such as provided herein with respect to the charge storing component 2710a of the memory cell 2702a. In some embodiments, floating gates 2706 of the plurality of memory cells 2702 are isolated and/or separated from each other, such as where a portion of the one or more dielectric layers 2714 separates two adjacent floating gates 2706 from each other.

In some embodiments, at least one of charge storing components 2710 or gates 408 of one, some and/or all memory cells of the plurality of memory cells 2702 are embedded in one or more dielectric layers 2714. In some embodiments, the one or more dielectric layers 2714 comprise at least one of the first dielectric layer 102 or the third dielectric layer 502. In some embodiments, the one or more dielectric layers 2714 are one or more interlayer dielectric layers.

In some embodiments, as shown in FIG. 27A, third dielectric components 2708, such as high-k dielectric components, of memory cells of the plurality of memory cells 2702 are isolated and/or separated from each other, such as where a portion of the one or more dielectric layers 2714 separates two adjacent third dielectric components 2708 from each other. In some embodiments, as shown in FIG. 27B, third dielectric components 2708, such as high-k dielectric components, of memory cells of the plurality of memory cells 2702 correspond to portions of a continuous dielectric layer 2712 that at least one of overlies or is in direct contact with floating gates 2706 of some and/or all charge storing components 2710 of the memory array structure 2700.

In some embodiments, a memory array provided herein, such as at least one of the memory array of the memory array structure 100, the memory array of the memory array structure 1100, the memory array of the memory array structure 1500, the memory array of the memory array structure 1800, the memory array of the memory array structure 2400, the memory array of the memory array structure 2500, the memory array of the memory array structure 2600, the memory array of the memory array structure 2700, or other memory array provided herein, comprises memory cells connected in series, such as where the memory array has a NAND memory configuration. In some embodiments, the first contact 1002 may be a source contact of the memory array and the second contact 1004 may be a drain contact of the memory array. In some embodiments, memory cells of the memory array are connected to a bit line in series. In some embodiments, the bit line is connected to a first contact of the source contact and the drain contact. In some embodiments, ground is connected to a second contact of the source contact and the drain contact. In some embodiments, a memory array structure comprises one or more contacts other than the first contact 1002 and the second contact 1004, such as shown in FIGS. 28A-28B.

Figure 28A:
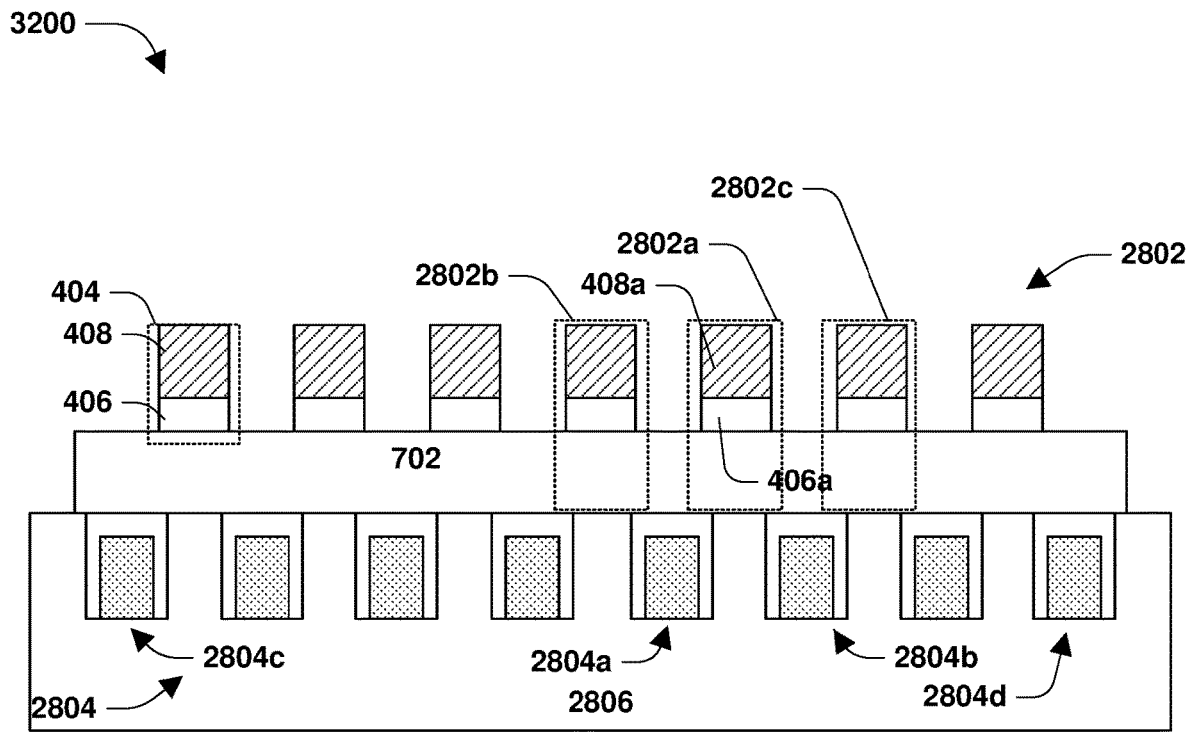
FIGS. 28A-28B illustrate a memory array structure, in accordance with some embodiments.
Figure 28B:
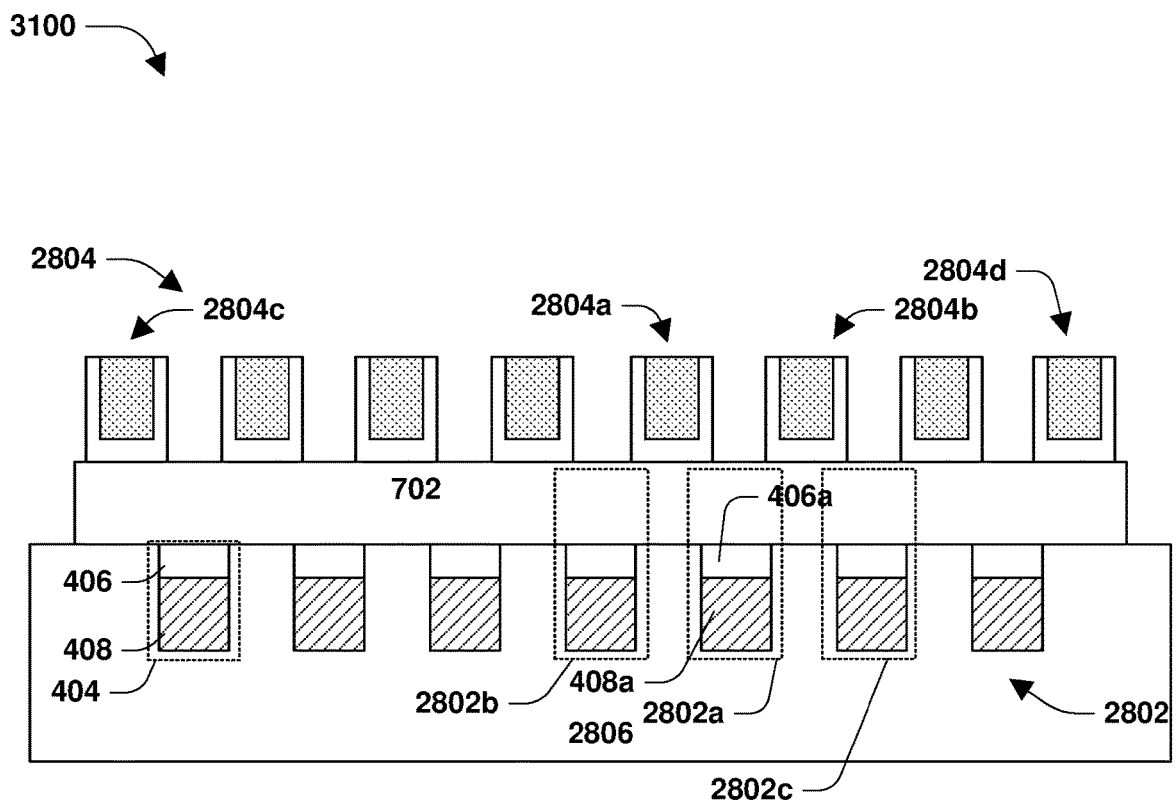

FIGS. 28A-28B illustrate a memory array structure 2800 according to some embodiments. In some embodiments, the memory array structure 2800 comprises a memory array, such as a non-volatile memory array. In some embodiments, the memory array is a flash memory array, such as a memory array that can be operated as at least one of NAND flash or NOR flash. The memory array comprises a plurality of memory cells 2802 comprising a memory cell 2802a. The memory cell 2802a comprises the gate 408a, such as a control gate of the memory cell 2802a, the charge storing component 406a, and a portion of the channel layer 702. In some embodiments, the memory cell 2802a comprises a transistor, such as a thin film transistor or other suitable transistor, wherein the transistor comprises at least one of the gate 408a or the charge storing component 406a, wherein a threshold voltage of the transistor is based upon a charge stored in the charge storing component 406a. In some embodiments, the memory array structure 2800 comprises a plurality of contacts 2804. In some embodiments, for each memory cell of one, some, and/or all memory cells of the plurality of memory cells 2802, the plurality of contacts 2804 comprises two contacts connected to the memory cell. In some embodiments, the plurality of contacts 2804 comprises a contact 2804a and a contact 2804b connected to the memory cell 2802a. In some embodiments, each contact of one, some and/or all contacts of the plurality of contacts 2804 is at least one of in direct contact with the channel layer 702 or in indirect contact with the channel layer 702. In some embodiments, the plurality of contacts 2804 are formed using one or more of the techniques shown in and/or described with respect to FIGS. 9-10. In some embodiments, contacts of the plurality of contacts 2840 are metal contacts.

In some embodiments, memory cells of the plurality of memory cells 2802 are connected in parallel, such as where the memory array has a NOR memory configuration. In some embodiments in which memory cells of the plurality of memory cells 2802 are connected in parallel, the memory cells are connected to a bit line in parallel. In some embodiments in which memory cells of the plurality of memory cells 2802 are connected in parallel, a first set of contacts of the plurality of contacts 2804 are connected to the bit line and a second set of contacts of the plurality of contacts 2804 are connected to ground. In some embodiments, contacts of the plurality of contacts 2804 alternate between bit line and ground. In some embodiments, the contact 2804a is connected to ground and the contact 2804b is connected to the bit line. In some embodiments, the contact 2804a provides a connection between ground and at least one of the memory cell 2802a or a memory cell 2802b adjacent the memory cell 2802a. In some embodiments, the contact 2804b provides a connection between the bit line and at least one of the memory cell 2802a or a memory cell 2802c adjacent the memory cell 2802a.

In some embodiments, memory cells of the plurality of memory cells 2802 are connected in series, such where the memory array has a NAND memory configuration. In some embodiments in which memory cells of the plurality of memory cells 2802 are connected in series, the memory cells are connected to a bit line in series. In some embodiments in which memory cells are connected in series, at least one of a first contact of outer contacts 2804c and 2804d is connected to the bit line or a second contact of the outer contacts 2804c and 2804d is connected to ground. In some embodiments, contacts, such as contact 2804a and contact 2804b, between the outer contacts 2804c and 2804d are not connected to the bit line and/or to other circuitry. In some embodiments, the contacts between the outer contacts 2804c and 2804d are dummy metals. In some embodiments, contacts between the outer contacts 2804c and 2804d provide connections between adjacent memory cells of the plurality of memory cells 2802. In one embodiment, the contact 2804a provides a connection between the memory cell 2802b and the memory cell 2802a. In one embodiment, the contact 2804b provides a connection between the memory cell 2802a and the memory cell 2802c. In some embodiments, at least one of dopant concentration or resistivity of the channel layer 702 in the memory array structure 2800 is required to be less irregular, such as having smaller differences in dopant concentration and/or resistivity, across at least some of the channel layer 702 as compared to memory array structures that do not comprise dummy metals, thereby providing for reduced complexity in forming and/or doping the channel layer 702.

In some embodiments, as shown in FIG. 28A, one, some and/or all memory cells of the plurality of memory cells 2802 overlie the channel layer 702 and one, some, and/or all contacts of the plurality of contacts 2804 underlie the channel layer 702. In some embodiments, as shown in FIG. 28A, one, some, and/or all contacts of the plurality of contacts 2804 are embedded in one or more dielectric layers 2806. In some embodiments, the one or more dielectric layers 2806 comprise at least one of the first dielectric layer 102 or the third dielectric layer 502. In some embodiments, the one or more dielectric layers 2806 are one or more interlayer dielectric layers.

In some embodiments, as shown in FIG. 28B, one, some and/or all memory cells of the plurality of memory cells 2802 underlie the channel layer 702 and one, some, and/or all contacts of the plurality of contacts 2804 overlie the channel layer 702. In some embodiments, as shown in FIG. 28B, at least one of charge storing components 406 or gates 408 of one, some and/or all memory cells of the plurality of memory cells 2802 are embedded in the one or more dielectric layers 2806.

Combinations of at least one of the one or more layers, features, structures, elements, etc. disclosed herein are within the scope of the present disclosure. Embodiments are contemplated in which a memory array structure, that comprises charge storing components corresponding to portions of a continuous section of the one or more second dielectric layers 302 (such as shown in and/or described with respect to FIG. 14), also comprises at least one of one or more access transistors 2404 (such as shown in and/or described with respect to FIG. 24), one or more gates 408 overlying the channel layer 702 (such as shown in and/or described with respect to FIGS. 25-26), one or more contacts underlying the channel layer 702 (such as shown in and/or described with respect to FIGS. 25 and 28A), contacts 2804 that comprise one or more contacts between outer contacts 2804c and 2804d (such as shown in and/or described with respect to FIGS. 28A-28B), memory cells connected in series, memory cells connected in parallel (such as shown in and/or described with respect to FIGS. 28A-28B), etc.

Embodiments are contemplated in which a memory array structure, that comprises one or more access transistors 2404 (such as shown in and/or described with respect to FIG. 24), also comprises at least one of charge storing components corresponding to portions of a continuous section of the one or more second dielectric layers 302 (such as shown in and/or described with respect to FIG. 14), charge storing components 2710 comprising floating gates 2706 for storing charge (such as shown in and/or described with respect to FIGS. 27A-27B), one or more gates 408 overlying the channel layer 702 (such as shown in and/or described with respect to FIGS. 25-26), one or more contacts underlying the channel layer 702 (such as shown in and/or described with respect to FIGS. 25 and 28A), contacts 2804 that comprise one or more contacts between outer contacts 2804c and 2804d (such as shown in and/or described with respect to FIGS. 28A-28B), memory cells connected in series, memory cells connected in parallel (such as shown in and/or described with respect to FIGS. 28A-28B), etc.

Embodiments are contemplated in which a memory array structure, that comprises a first set of gates 2604 overlying the channel layer 702 and a second set of gates 2602 underlying the channel layer 702 (such as shown in and/or described with respect to FIGS. 26A-26B), also comprises at least one of one or more access transistors 2404 (such as shown in and/or described with respect to FIG. 24), charge storing components corresponding to portions of a continuous section of the one or more second dielectric layers 302 (such as shown in and/or described with respect to FIG. 14), charge storing components 2710 comprising floating gates 2706 for storing charge (such as shown in and/or described with respect to FIGS. 27A-27B), one or more contacts underlying the channel layer 702 (such as shown in and/or described with respect to FIGS. 25 and 28A), etc.

Herein, in accordance with some embodiments, a memory array structure that is shown and/or described to have memory cells with charge storing components 404 can comprise memory cells with charge storing components 2710 in place of or in addition to the memory cells with the charge storing components 404. In some embodiments, one, some and/or all charge storing components 404 of a memory array structure can be replaced with charge storing components 2710.

In some embodiments, a semiconductor device is provided. The semiconductor device comprises a memory array structure in accordance with one or more of the embodiments provided herein, such as one or more embodiments shown in and/or described with respect to FIGS. 1-28 and/or one or more other embodiments. In some embodiments, the memory array structure of the semiconductor device comprises at least one of the one or more layers, features, structures, elements, etc. of at least one of the memory array structure 100 (shown in and/or described with respect to FIGS. 1-10), the memory array structure 1100 (shown in and/or described with respect to FIGS. 11-14), the memory array structure 1500 (shown in and/or described with respect to FIGS. 15-17), the memory array structure 1800 (shown in and/or described with respect to FIGS. 18-23), the memory array structure 2400 (shown in and/or described with respect to FIG. 24), the memory array structure 2500 (shown in and/or described with respect to FIG. 25), the memory array structure 2600 (shown in and/or described with respect to FIGS. 26A-26B), the memory array structure 2700 (shown in and/or described with respect to FIGS. 27A-27B), the memory array structure 2800 (shown in and/or described with respect to FIGS. 28A-28B), or other memory array structure within the scope of the present disclosure.

Figure 29:
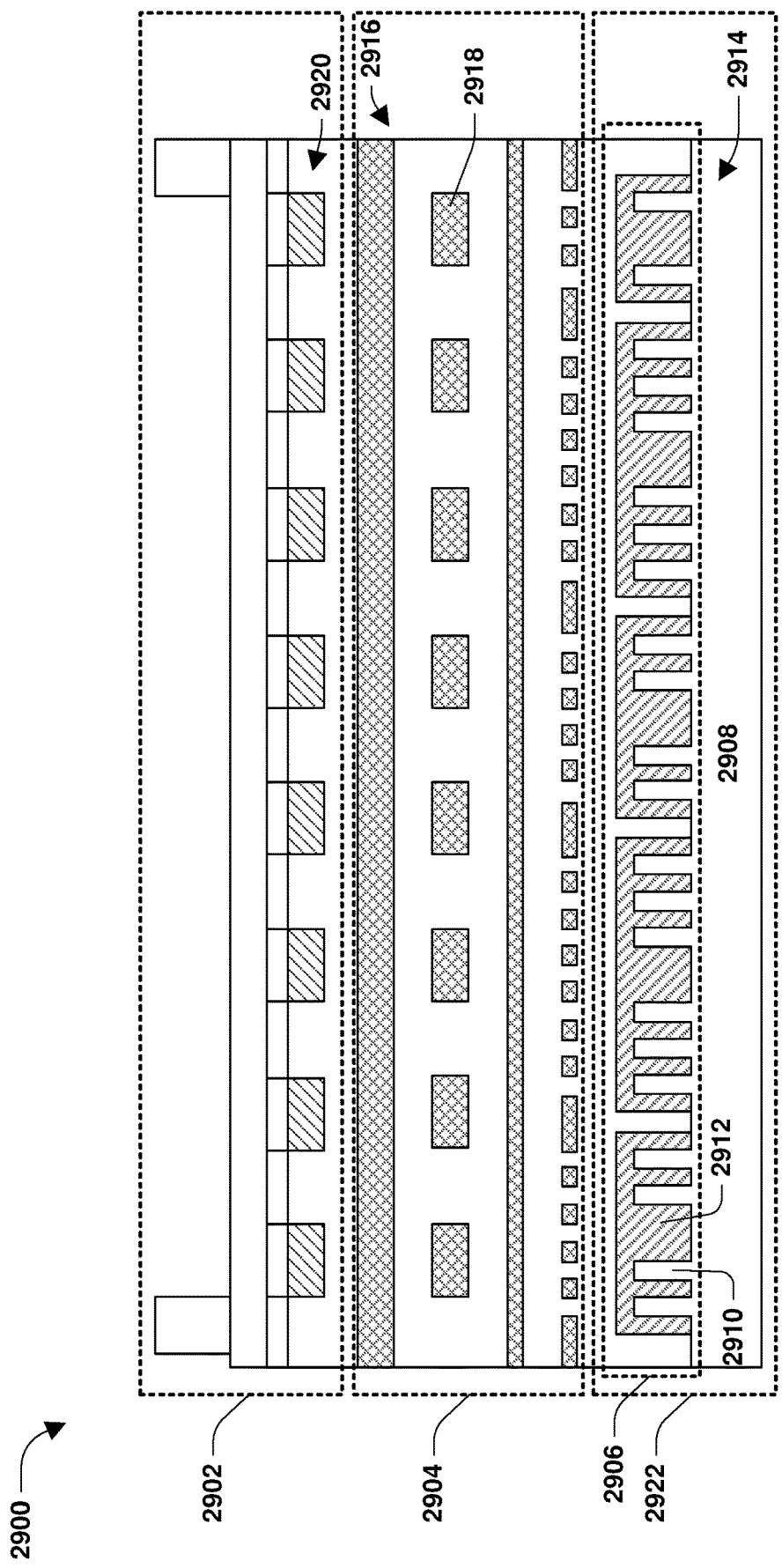
FIG. 29 illustrates a semiconductor device, in accordance with some embodiments.

FIG. 29 illustrates a semiconductor device 2900 according to some embodiments. In some embodiments, the semiconductor device 2900 comprises a memory array structure 2902. The memory array structure 2902 comprises a memory array 2920, such as a non-volatile memory array, comprising a plurality of memory cells. In some embodiments, the memory array 2920 is a flash memory array, such as a memory array that can be operated as at least one of NAND flash or NOR flash. In some embodiments, the memory array structure 2902 comprises a memory array structure in accordance with one or more of the embodiments provided herein, such as one or more embodiments shown in and/or described with respect to FIGS. 1-28 and/or one or more other embodiments. In some embodiments, the memory array structure 2902 comprises at least one of the one or more layers, features, structures, elements, etc. of at least one of the memory array structure 100 (shown in and/or described with respect to FIGS. 1-10), the memory array structure 1100 (shown in and/or described with respect to FIGS. 11-14), the memory array structure 1500 (shown in and/or described with respect to FIGS. 15-17), the memory array structure 1800 (shown in and/or described with respect to FIGS. 18-23), the memory array structure 2400 (shown in and/or described with respect to FIG. 24), the memory array structure 2500 (shown in and/or described with respect to FIG. 25), the memory array structure 2600 (shown in and/or described with respect to FIGS. 26A-26B), the memory array structure 2700 (shown in and/or described with respect to FIGS. 27A-27B), the memory array structure 2800 (shown in and/or described with respect to FIGS. 28A-28B), or other memory array structure within the scope of the present disclosure.

The semiconductor device 2900 comprises a logic structure 2906. In some embodiments, the logic structure 2906 is in a FEOL structure 2922 of the semiconductor device 2900. In some embodiments, the logic structure 2906 comprises a plurality of logic cells 2914. In some embodiments, each logic cell of one, some and/or all logic cells of the plurality of logic cells 2914 comprises at least one of a transistor, a diode, or other component. In some embodiments, logic cells of the plurality of logic cells 2914 may comprise at least one of one or more field effect transistors, such as one or more fin field effect transistors (FinFET), or one or more other suitable transistors. In some embodiments, logic cells of the plurality of logic cells 2914 are configured to perform one or more logic functions, such as at least one of executing one or more instructions, performing computer processing, etc. In some embodiments, the semiconductor device 2900 comprises a logic chip, such as at least one of a processor, a controller, a central processing unit (CPU), a graphics processing unit (GPU), etc. In some embodiments in which logic cells of the plurality of logic cells 2914 comprise one or more FinFETs, the plurality of logic cells 2914 may comprise at least one of one or more fins 2910 of the one or more FinFETs or one or more gates 2912 of the one or more FinFETs. In some embodiments, logic cells of the plurality of logic cells 2914 overlie a substrate 2908. The substrate 2908 comprises at least one of an epitaxial layer, a silicon-on-insulator (SOI) structure, a wafer, or a die formed from a wafer. Other structures and/or configurations of the substrate 2908 are within the scope of the present disclosure. The substrate 2908 comprises at least one of silicon, germanium, carbide, arsenide, gallium, arsenic, phosphide, indium, antimonide, SiGe, SiC, GaAs, GaN, GaP, InGaP, InP, InAs, InSb, GaAsP, AlInAs, AlGaAs, GaInAs, GaInP, GaInAsP, or other suitable material. According to some embodiments, the substrate 2908 comprises monocrystalline silicon, crystalline silicon with a <100> crystallographic orientation, crystalline silicon with a <110> crystallographic orientation or other suitable material. In some embodiments, the substrate 2908 comprises at least one doped region.

The semiconductor device 2900 comprises one or more interconnection layers 2916. In some embodiments, the one or more interconnection layers 2916 are in a BEOL structure 2904 of the semiconductor device 2900. The one or more interconnection layers 2916 comprise at least one of patterned dielectric layers or conductive layers that provide interconnections, such as wiring, between at least one of various doped features, circuitry, input/output, etc. of the semiconductor device 2900. In some embodiments, the one or more interconnection layers 2916 comprise at least one of one or more interlayer dielectric layers or multilayer interconnect structures, such as at least one of contacts, vias, metal lines, or a different type of structure. Other structures and configurations of the one or more interconnection layers 2916 are within the scope of the present disclosure. For purposes of illustration, the one or more interconnection layers 2916 comprise conductive lines 2918, where the positioning and configuration of such conductive lines might vary depending upon design needs.

In some embodiments, the memory array 2920 of the memory array structure 2902 overlies at least one of the logic structure 2906, the one or more interconnection layers 2916, or the substrate 2908. In some embodiments, the memory array 2920 at least one of overlies or is within the BEOL structure 2904. In some embodiments, one, some and/or all memory cells of the memory array 2920 overlie one, some and/or all logic cells of the logic structure 2906. In some embodiments, one, some and/or all gates 408 of memory cells of the memory array 2920 are embedded in one or more dielectric layers, wherein the one or more dielectric layers overlie at least one of the logic structure 2906, the one or more interconnection layers 2916, or the substrate 2908. In some embodiments, the one or more dielectric layers at least one of overlie or are within the BEOL structure 2904. In some embodiments, the one or more dielectric layers comprise at least one of the first dielectric layer 102, the third dielectric layer 502, the one or more dielectric layers 2410, the one or more dielectric layers 2610, the one or more dielectric layers 2714, or the one or more dielectric layers 2806. In some embodiments, the memory array structure 2902 is connected to the logic structure 2906, such as where the logic structure 2906 is connected to at least one of one or more contacts or one or more gates 408 of the memory array structure 2902. In some embodiments, the one or more interconnection layers 2916 provide one or more connections between the logic structure 2906 and the memory array structure 2902, such as one or more connections between the logic structure 2906 and at least one of one or more contacts or one or more gates 408 of the memory array structure 2902.

In some embodiments, the logic structure 2906 is formed over the substrate 2908. The memory array 2920 is formed over the logic structure 2906. In some embodiments, prior to forming the memory array 220, the one or more interconnection layers 2916 are formed over the logic structure 2906, wherein the one or more interconnection layers 2916 are between the memory array 2920 and the logic structure 2906.

In some embodiments, logic cells of the logic structure 2906 perform computations and/or processing using data stored in memory cells of the memory array structure 2902, thereby providing for in-memory computing and/or near-memory computing of the semiconductor device 2900 even where memory cells are not included in the logic structure 2906 and/or do not take up space in the FEOL structure 2922 of the semiconductor device 2900, thereby providing for more space, in the FEOL structure 2922, for logic cells while providing for in-memory computing and/or near-memory computing of the semiconductor device 2900. In some embodiments, the semiconductor device 2900 provides for processing and/or computing with increased speed as compared to semiconductor devices, such as logic chips, that are connected to memory circuitry on separate devices, such as standalone flash memory. In some embodiments, the increased speed is a result of a reduced amount of time it takes for the logic structure 2906 to retrieve data from memory cells of the memory array structure 2902. The increased speed enables the semiconductor device 2900 to perform tasks that require fast processing and/or computing, such as at least one of machine learning applications, artificial intelligence, etc.

In some semiconductor devices, a memory array is formed laterally coincident with logic cells of a logic structure, such as within FEOL structures of the semiconductor devices. In some embodiments, compared with these semiconductor devices, the semiconductor device 2900 can be manufactured with at least one of reduced manufacturing costs, reduced complexity, increased memory cell density, etc. In some embodiments, the reduced manufacturing costs and/or the reduced complexity are a result of a complexity and/or difficulty in forming memory cells in an FEOL structure comprising logic cells as compared to forming memory cells over an FEOL structure in accordance with embodiments provided herein, such as due to complexity and/or difficulty in co-integrating memory cells with logic cells. In some embodiments, the reduced manufacturing costs, the reduced complexity and/or the increased memory cell density are a result of using thin film transistor processing to form memory cells of the memory array structure 2902, wherein in some cases thin film transistor processing may not be possible for forming memory cells that are co-integrated with logic cells in an FEOL structure, and wherein memory cells that are to be co-integrated with logic cells in an FEOL structure may be required to have more complex transistor structures.

In some embodiments, the semiconductor device 2900 comprises a single wafer, such as where the logic structure 2906, the one or more interconnection layers 2916 and the memory array structure 2902 are formed on the single wafer. In some embodiments, the memory array structure 2902 is formed by processing the single wafer comprising the logic structure 2906 and the one or more interconnection layers 2916. In some embodiments, the logic structure 2906 is formed on the single wafer, the one or more interconnection layers 2916 are formed over the logic structure 2906, and the memory array structure 2902 is formed over the one or more interconnection layers 2916.

In some embodiments, the semiconductor device 2900 comprises multiple wafers. In some embodiments, the memory array structure 2902 is formed on a first wafer separate from a second wafer comprising at least one of the logic structure 2906 or the one or more interconnection layers 2916. In some embodiments, the memory array structure 2902 is formed by processing the first wafer. In some embodiments, at least one of the logic structure 2906 or the one or more interconnection layers 2916 are formed by processing the second wafer. In some embodiments, the one or more interconnection layers 2916 are formed over the logic structure 2906. In some embodiments, when the memory array structure 2902 is formed on the first wafer, the first wafer is bonded with the second wafer, such as by at least one of an adhesive, one or more bonding layers, a bonding process, or other suitable techniques. In some embodiments in which the first wafer is bonded with the second wafer using the one or more bonding layers, the one or more bonding layers are between the first wafer and the second wafer.

In some embodiments, one or more materials of the channel layer 702 depend upon whether the memory array structure 2902 is formed by monolithically processing a wafer comprising at least one of the logic structure 2906 or the one or more interconnection layers 2916 or whether the memory array structure 2902 is formed by processing a wafer separate from at least one of the logic structure 2906 or the one or more interconnection layers 2916. In some embodiments in which the memory array structure 2902 is formed by monolithically processing a wafer comprising at least one of the logic structure 2906 or the one or more interconnection layers 2916, the channel layer 702 comprises one or more first materials that are deposited at a temperature that is at most a threshold temperature. In some embodiments, the threshold temperature is based upon, such as equal to, a temperature that does not damage one or more components, such as at least one of wiring, circuitry, transistors, etc. in at least one of the one or more interconnection layers 2916 or the logic structure 2906. In some embodiments, the one or more first materials comprise an oxide semiconductor material such as at least one of InGaZnO, InSnO, $In_2O_3$, $Ga_2O_3$, InGaZnO:Si, or other suitable material.

In some embodiments in which the memory array structure 2902 is formed by processing a wafer separate from at least one of the logic structure 2906 or the one or more interconnection layers 2916, the channel layer 702 comprises one or more second materials that are deposited at a temperature that is less than, equal to or greater than the threshold temperature. In some embodiments, the one or more second materials comprise at least one of a III-V compound semiconductor, silicon, silicon germanium, indium gallium arsenide, gallium arsenide, indium arsenide, or other suitable material. In some embodiments, the one or more second materials provide for higher electron mobility than the one or more first materials.

According to some embodiments, at least one of the one or more layers, features, structures, elements, etc. disclosed herein are in direct contact with another of the one or more layers, features, structures, elements, etc. disclosed herein. According to some embodiments, at least one of the one or more layers, features, structures, elements, etc. disclosed herein are not in direct contact with another of the one or more layers, features, structures, elements, etc. disclosed herein, such as where one or more intervening, separating, etc. layers, features, structures, elements, etc. exist.

In some embodiments, a semiconductor device is provided. The semiconductor device includes a logic structure overlying a semiconductor substrate of the semiconductor device. The logic structure includes a plurality of logic cells. The semiconductor device includes one or more interconnection layers, overlying the logic structure, in a BEOL structure of the semiconductor device. The semiconductor device includes a non-volatile memory array including a plurality of memory cells. The non-volatile memory array overlies the logic structure and the one or more interconnection layers. The non-volatile memory array at least one of overlies or is within the BEOL structure.

In some embodiments, a semiconductor device is provided. The semiconductor device includes a dielectric layer overlying a semiconductor substrate. The semiconductor device includes a plurality of control gates embedded in the dielectric layer, wherein a control gate of the plurality of control gates is part of a memory cell of a non-volatile memory array. The semiconductor device includes a channel layer overlying the dielectric layer, wherein a charge storing component of the memory cell separates the channel layer from the control gate of the plurality of control gates. The semiconductor device includes a plurality of contacts in contact with the channel layer.

In some embodiments, a method is provided. The method includes forming a logic structure over a semiconductor substrate. The logic structure includes a plurality of logic cells. The method includes forming one or more interconnection layers over the logic structure. The method includes forming a non-volatile memory array, including a plurality of memory cells, over the one or more interconnection layers, wherein the one or more interconnection layers are between the logic structure and the non-volatile memory array.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor device, comprising:
a dielectric layer overlying a semiconductor substrate;
a first plurality of control gates embedded in the dielectric layer, wherein a control gate of the first plurality of control gates is part of a memory cell of a non-volatile memory array;
a channel layer overlying the dielectric layer, wherein a charge storing component of the memory cell separates the channel layer from the control gate of the first plurality of control gates;
a plurality of contacts in contact with the channel layer; and
a second plurality of control gates overlying the channel layer, wherein a control gate of the second plurality of control gates overlies a region between two adjacent control gates of the first plurality of control gates.

2. The semiconductor device of claim 1, wherein:
the channel layer comprises an oxide semiconductor material.

3. The semiconductor device of claim 1, wherein:
the plurality of contacts overlie the channel layer.

4. The semiconductor device of claim 1, wherein:
the second plurality of control gates contact the channel layer.

5. The semiconductor device of claim 1, wherein:
the channel layer overlies the control gate of the first plurality of control gates.

6. The semiconductor device of claim 1, comprising:
one or more interconnection layers, underlying the dielectric layer, in a Back End of Line (BEOL) structure of the semiconductor device.

7. The semiconductor device of claim 6, comprising:
a logic structure underlying the BEOL structure and overlying the semiconductor substrate, wherein the logic structure comprises a plurality of logic cells.

8. A semiconductor device, comprising:
a dielectric layer overlying a semiconductor substrate;
a first plurality of control gates embedded in the dielectric layer, wherein a control gate of the first plurality of control gates is part of a first memory cell of a non-volatile memory array;
a channel layer overlying the dielectric layer, wherein a first charge storing component of the first memory cell separates the channel layer from the control gate of the first plurality of control gates;
a plurality of contacts in contact with the channel layer; and
a second plurality of control gates overlying the channel layer, wherein a control gate of the second plurality of control gates overlies the control gate of the first plurality of control gates.

9. The semiconductor device of claim 8, wherein:
the channel layer comprises an oxide semiconductor material.

10. The semiconductor device of claim 8, wherein:
the plurality of contacts overlie the channel layer.

11. The semiconductor device of claim 8, wherein:
the control gate of the second plurality of control gates is vertically coincident with the control gate of the first plurality of control gates by a length that is between 10% and 40% of a pitch of the second plurality of control gates.

12. The semiconductor device of claim 8, comprising:
a second charge storing component separating the control gate of the second plurality of control gates from the channel layer.

13. The semiconductor device of claim 12, wherein:
the second charge storing component and the control gate of the second plurality of control gates are part of a second memory cell of the non-volatile memory array.

14. The semiconductor device of claim 8, wherein:
the second plurality of control gates contact the channel layer.

15. The semiconductor device of claim 8, wherein:
the channel layer overlies the control gate of the first plurality of control gates.

16. The semiconductor device of claim 8, comprising:
one or more interconnection layers, underlying the dielectric layer, in a Back End of Line (BEOL) structure of the semiconductor device.

17. A semiconductor device, comprising:
a first dielectric layer overlying a semiconductor substrate;
a plurality of control gates embedded in the first dielectric layer, wherein a control gate of the plurality of control gates is part of a memory cell of a non-volatile memory array;
a channel layer overlying the first dielectric layer, wherein:
a charge storing component of the memory cell separates the channel layer from the control gate of the plurality of control gates, and
the channel layer comprises an oxide semiconductor material; and
a plurality of contacts in contact with the channel layer.

18. The semiconductor device of claim 17, wherein:
the plurality of contacts overlie the channel layer.

19. The semiconductor device of claim 17, wherein:
the oxide semiconductor material comprises at least one of InGaZnO, InSnO, $In_2O_3$, $Ga_2O_3$, or InGaZnO:Si.

20. The semiconductor device of claim 17, comprising:
a second dielectric layer between the control gate of the plurality of control gates and the channel layer.

* * * * *